United States Patent [19]
Tokunoh et al.

[11] Patent Number: 5,892,678
[45] Date of Patent: Apr. 6, 1999

[54] LSI DESIGN AUTOMATION SYSTEM

[75] Inventors: Seiji Tokunoh, Osaka; Noriko Matsumoto, Kyoto; Tamotsu Nishiyama, Osaka, all of Japan

[73] Assignee: Matsushita Electric Industrial Co., Ltd., Osaka, Japan

[21] Appl. No.: 943,524

[22] Filed: Oct. 3, 1997

Related U.S. Application Data

[63] Continuation of Ser. No. 408,722, Mar. 22, 1995, abandoned.

[30]     Foreign Application Priority Data

Mar. 24, 1994  [JP]  Japan ................................. 6-054051
Feb. 28, 1995  [JP]  Japan ................................. 7-039882

[51] Int. Cl.$^6$ .................................................. G06F 15/00
[52] U.S. Cl. ........................ 364/488; 364/489; 706/921; 326/38
[58] Field of Search ..................... 364/488, 489, 364/490, 491, 468, 578, 757, 468.01, 484; 395/500, 100, 921, 919, 920, 51; 371/22.1, 25.1, 22.4, 27, 22.3; 382/145, 243; 326/38, 36

[56]              References Cited

U.S. PATENT DOCUMENTS

| | | | |
|---|---|---|---|
| 4,803,636 | 2/1989 | Nishiyama et al. | 364/488 |
| 4,896,272 | 1/1990 | Kurosawa | 364/488 |
| 4,942,536 | 7/1990 | Watanabe et al. | 364/490 |
| 4,964,056 | 10/1990 | Bekki et al. | 364/488 |
| 5,038,294 | 8/1991 | Arakawa et al. | 364/490 |
| 5,333,032 | 7/1994 | Matsumoto et al. | 364/488 |
| 5,359,539 | 10/1994 | Matsumoto et al. | 364/488 |
| 5,416,721 | 5/1995 | Nishiyama et al. | 364/491 |
| 5,422,833 | 6/1995 | Kelem et al. | 364/578 |
| 5,519,630 | 5/1996 | Nishiyama et al. | 364/490 |
| 5,530,664 | 6/1996 | Tsubata et al. | 364/488 |
| 5,563,800 | 10/1996 | Matsumoto et al. | 364/490 |

FOREIGN PATENT DOCUMENTS 0 584 828   3/1994   European Pat. Off. .

OTHER PUBLICATIONS

N. Masumoto et al., "An Object–Oriented Method for Automatic Custom LSI Design", The Journal of Information Processing Society of Japan, 45th National Meeting (1992), vol. 6, pp. 19–20, and an English abstract.

S. Tokunoh et al., "A Technique for Generating Reusable Circuit Components in A Custom LSI Design Automation System", The Journal of Information Processing Society of Japan, 47th National Meeting (1993), vol. 6, pp. 89–90, and an English abstract thereof.

(List continued on next page.)

*Primary Examiner*—Jacques H. Louis-Jacques
*Attorney, Agent, or Firm*—McDermott, Will & Emery

[57]                ABSTRACT

An improved LSI design automation system includes: an input unit, a circuit component storage unit, a circuit component selection unit, a design method decision unit, a design process unit, and a component entry unit. The input unit receives LSI function and performance information as a requirements specification and LSI component configuration information. The circuit component storage unit collectively stores a circuit data item, design method information items, and performance information items, as a circuit component. The circuit component selection unit selects a circuit component from the circuit component storage unit for implementation of a desired circuit. The design method decision unit selects an optimum design method information item from the design method information items held by each circuit component. The design process unit generates, modifies, and evaluates a circuit. The component entry unit enters a result of the modification made during the design and a newly generated circuit component into the circuit component storage unit.

17 Claims, 24 Drawing Sheets

OTHER PUBLICATIONS

Proceedings of the IFIP WG 10.2 10th Intl. Symposium on Computer Hard–ward Description Languages & Their Applns., "An Object–Oriented Frame–work Supporting the full High–Level Synthesis Trajectory", Lanneer, D.

Proceedings of the IFIP WG 10.2 Int. Symposium on Computer Hard–ward Description Languages & Their Applns., "Hierarchical Modeling of the VLSI Design Process", Hekmatpour, A. et al., vol. 6, No. 2.

Proceedings of the IFIP WG 10.2 10th Intl. Symposium on Computer Hard–ward Description Languages & Their Applns., "Evolution of CAD tools towards 3rd generation custom VLSI design", De Man, H., vol. 22, No. 1.

Euro–Dac '92. European Design Automation Conference, Euro–VHDL '92 (Cat. No. 92CH3126–0), Hamburg, Germany, 7–10 Sep. 1992, ISBN 0–8186–2780–8, 1992, Los Alamitos, CA, USA, IEEE Comput. Soc. Press. pp. 215–221, "Chip assembly in the Playout VLSI design system".

26th ACM/IEEE Design Automation Conf. (ACM Nol. 477890 & IEEE Cat. No. 89CH2734–2), Las Vegas, NV, 25–29 Jun. 1989, ISBN 0–89791–310–8, 1989, NY, NY, pp. 814–817, Siepmann, E. et al.: "An object–oriented data model fo rthe VLSI design system playout".

IEEE Transactions on Computer–Aided Design of Integrated Circuits and Systems, Jan. 1985, vol. CAD–4, No. 1, ISSN 0278–0070, pp. 12–22, Ueda et al., "CHAMP: chip floor plan for heirarchical VSLI layout design", pp. 12–14: II. Chip Floor Plan Problem Overview.

Computer Grahics Tokyo '84 Proceedings, Tokyo, Japan, 24–27 Apr. '84, Japan Mgmt. Assoc., Japan pp. T4–4/1–9, Ueda, K. et al.: "Interactive VLSI chip floor design using color graphics".

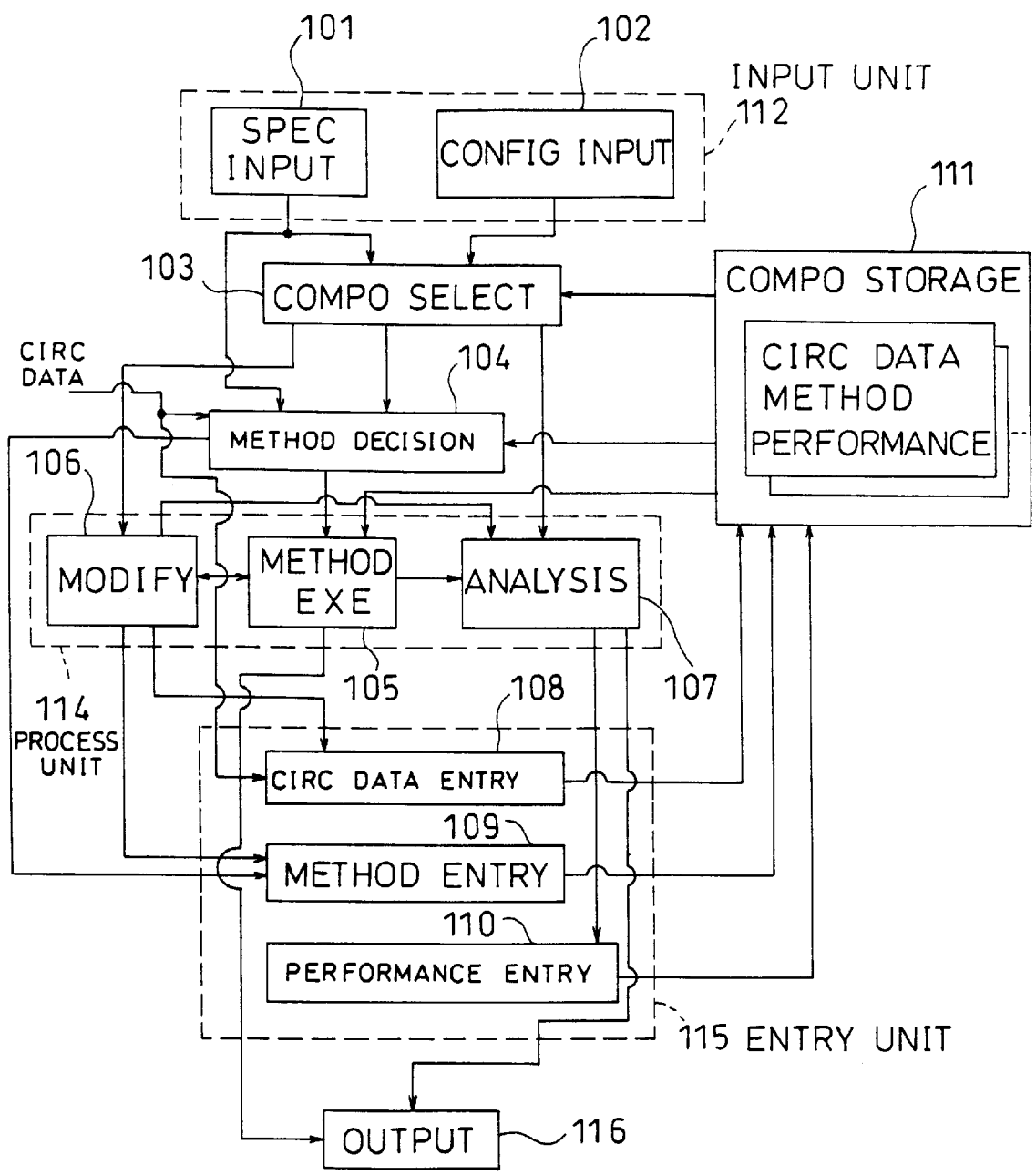
F I G .1

SPEC OPERATION AT 40 MHz

CIRCUIT COMPONENT A

FIG. 13

CIRCUIT COMPONENT TRANSLATION INFORMATION

```
DESIGN RULE CHANGE · · · TECHNOLOGY CHANGE
    PROCESS RULE CHANGE FROM 1.2-μm TO 0.8-μm

CIRCUIT DATA TRANSLATION :
    CELL NAME CHANGE
      · FUNCTIONALLY-EQUIVALENT CELL'S NAME REPLACEMENT
      · LIBRARY REFERENCE PATH CHANGE
    LAYOUT CELL AUTOMATIC TRANSLATION TOOL EXECUTION
      · LAYOUT TECHNOLOGY AUTOMATIC TRANSLATION TOOL "A" EXECUTION

DESIGN METHOD CHANGE :
    ACTIVE LIBRARY CHANGE ACCORDING TO TECHNOLOGY
      · LOGIC SYNTHESIS LIBRARY CHANGE
          (LIBRARY B → C  LOGICAL SYNTHESIS PARAMETER CHANGE)
      · LOGIC VERIFICATION LIBRARY CHANGE
          (LIBRARY D → E  REFERENCE PATH CHANGE)
    DESIGN TOOL CHANGE
      · ACTIVE LAYOUT TOOL REPLACEMENT
          (AUTOMATIC PLACE & ROUTE TOOL F → G
           TOOL, EXECUTION PARAMETER CHANGE)
    DESIGN PARAMETER CHANGE
      · PARAMETER CHANGE ACCORDING TO PERFORMANCE
    DETERMINATION OF THE ORDER IN WHICH DESIGN TOOLS ARE USED
      · DETERMINATION OF THE ORDER IN WHICH DESIGN TOOLS INCLUDING
        NEW DESIGN TOOLS ARE APPLIED
```

FIG. 17
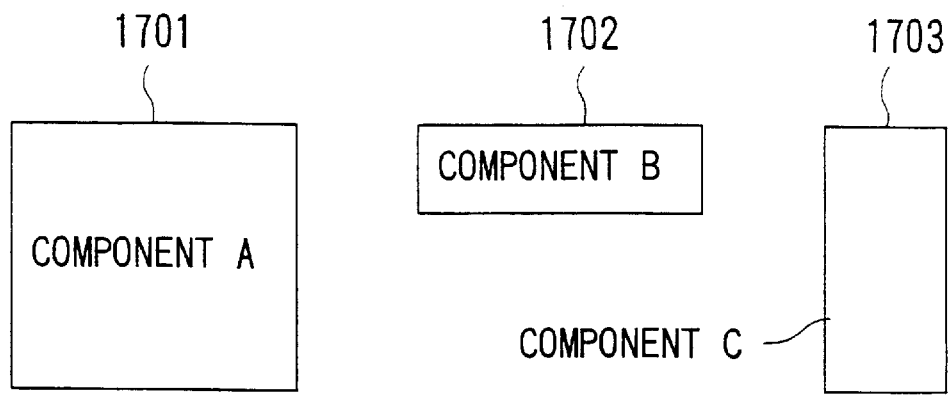
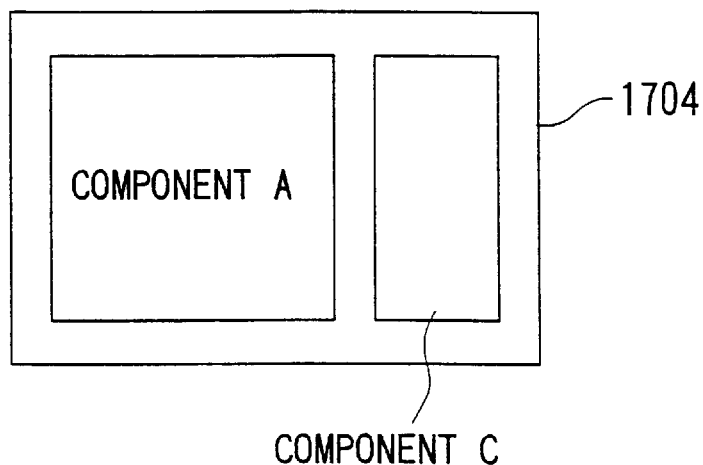

TARGET CIRCUIT'S CONFIGURATION

AREA OPTIMIZATION

CIRCUIT COMPONENT

BLOCK POSITION INFORMATION

FLOOR PLAN INFORMATION

LSI DESIGN AUTOMATION SYSTEM

This is a file wrapper continuation application of application Ser. No. 08/408,722 filed Mar. 22, 1995 now abandoned.

BACKGROUND OF THE INVENTION

This invention generally relates to the field of LSI design automation. More particularly it pertains to a design automation system for design of an LSI (large scale integrated circuit) capable of making optimum reuse of existing design resources, and to an LSI design automation method for use by an LSI design automation system.

A high-performance LSI requires a design technique capable of making optimum reuse of existing design resources (hereinafter called the resource-reusable design technique).

The resource-reusable design is performed based on the information about the function and performance of an existing design resource. However, layout data for use by a resource-reusable design method is fixed in, for example, the circuit area. Reuse of such layout data produces some problems, since it lacks flexibility. For example, it cannot deal with a partial functional modification. On the other hand, there is a technique known in the art. In this technique, data is reused which is written by a Hardware Description Language (HDL) capable of flexible reuse of existing design resources. However, this technique is most likely to fail to generate a circuit conforming to the designer's function and performance requirements.

There has been offered an approach. In this approach not only circuit data but also associated design method information is reused with a view to optimizing the design resource performance and implementing a resource-reusable design technique with broad flexibility. Matsumoto et al reported a technique in a paper entitled "An Object-Oriented Method for Automatic Custom LSI Design," the Journal of Information Processing Society of Japan, 45th National Fitting (1992), Vol. 6, pp. 19–20. In accordance with this technique, circuit data, design method information, and other information of a design resource are collectively stored as a circuit component and reused in order to improve the efficiency of LSI design.

Where an LSI is practically designed using a resource-reusable design technique, many circuit components with different functions are combined to implement more sophisticated functions. However, a finally-obtained LSI resulting from the above-noted design method produces the problem that it does not conform to the timing requirements although it functions as designed. This method is not able to generate a desired circuit.

Practically, the timing, the circuit form, and the like must be changed by partly modifying a component, by changing design method information contained in a component, and by replacing a component with another component, to implement a circuit capable of fitting the requirements specification. However, practically it is not easy to modify circuit data and design method information for reuse purposes. Neither an optimum combination of components nor layout information necessary for implementation of a specific function is defined. Therefore the information about a combination of components capable of fitting a requirements specification must be found by trial-and-error.

To facilitate a way of modifying a component and to implement a way of defining an optimum combination of components are considered important.

If a change in the design rules (e.g., the technology change and the design tool change) is required, this will be a bar to the reuse of existing design resources. Especially, for the case of a design system that makes reuse of circuit data as well as design method information to automatically design an LSI, the circuit data change and the design method information change must be made according to the change in the design rules, and circuit data and design method information conforming to such a change must be extracted and stored.

Accordingly, construction of a frame for efficiently making changes in the circuit data and the design method information according to the design rule change becomes a critical subject.

SUMMARY OF THE INVENTION

With a view to providing a solution to the above-noted problems with the prior art techniques, the present invention was made. Accordingly it is a general object of the present invention to provide an improved LSI design automation system capable of automatically storing a design modification method and reusing such a stored design modification method, in order to enhance the efficiency of resource-reusable design.

The above-noted object of the present invention is achieved as follows. After a circuit data item held by a circuit component (or an information item descriptive of a performance that is implemented by a circuit resulting from a design method modification) and a modification method are related to each other, they are stored and controlled. Such a stored modification method becomes reusable for new design work, thereby not only implementing design automation but also generating a circuit conforming to the requirements specification at high efficiency.

Additionally, in accordance with the present invention, information about the component combination is stored in order to implement higher-performance circuit generation. Since a modification method is automatically stored, this provides the advantage that the efficiency of design increases with repeating resource-reusable design work. Further, if the contents of a modification are stored as a design method information item, this not only increases component versatility in the resource-reusable design but also improves the resource-reusable design efficiency.

Further, in accordance with the present invention, both information about the circuit data change and information about the design method change are applied to a circuit component itself for implementing reuse of circuit components according to the design rule change. This enables a circuit component conforming to the design rule to be generated and permits the circuit component to be reused. If a circuit component has a hierarchical structure, the circuit component modification method information according to the design rules is to be controlled by subordinate circuit components located at higher positions in the hierarchy. The reason for this is that a circuit component change to conform to the design rule is not made according to individual circuit data and design method information contained in the components in the hierarchy. All the circuit components are changed according to a given definition, depending on the design rule. Additionally, such arrangement not only facilitates the control of component modification methods but also enables the minimization of components in size.

More specifically, the present invention provides an improved LSI design automation system which includes the following: an input unit, a circuit component storage unit, a circuit component selection unit, a design method decision unit, a design process unit, and a component entry unit. The input unit receives LSI function and performance information as a requirements specification as well as LSI component configuration information. The circuit component storage unit collectively stores a circuit data item, design method information items, and performance information items as a circuit component. The circuit component selection unit selects a circuit component from the circuit component storage unit for implementing a desired circuit. The design method decision unit selects an optimum design method information item from the design method information items held by each circuit component. The design process unit generates, modifies, and evaluates a circuit. The component entry unit enters into the circuit component storage unit a result of the modification made during the design work and a newly generated circuit component.

As described above, the input unit inputs a requirements specification and circuit configuration information. The circuit component selection unit selects from the circuit component storage unit a circuit component necessary for fitting the requirements specification. The design method decision unit determines a design method information item to the selected circuit component for generating a circuit conforming to the requirements specification. In the design process unit, the determined design method information is applied to the selected circuit component and the generated circuit is evaluated and modified to generate a new circuit conforming to the requirements specification. Both the performance of the circuit generated and the contents of the modification made by the design process unit are entered by the component entry unit into the circuit component storage unit as a circuit component information item.

In the design method decision unit, a design method information item is selected on the basis of performance information held by a circuit component. This enables optimum reuse of a component for various types of design. Additionally, a design method information item that is applied to a new circuit can be determined on the basis of the existing design method and performance information. This permits the design of an LSI using new circuit data to be performed without taking into account a particular design method to implement a circuit conforming to the requirements specification. Additionally, the relation of the design method with the circuit component performance is derived from the information held by a circuit component, and a design method for implementing a desired performance can be generated automatically. A circuit conforming to the requirements specification can be generated, without being aware of the existence of a design method that fits the requirement specification.

Contents of a circuit modification are entered automatically by means of the component entry unit. Particularly, when a design method change is made, such a change is stored automatically as a design method information item, or as a circuit component information item. When a circuit data change is made, such a change is stored automatically as a new circuit component. Therefore, the more the LSI design automation system performs design work, the more it learns from previously made modifications and builds up design knowledge. This provides a general-purpose circuit component library capable of improving the design efficiency.

As described above, in accordance with the present invention, a plurality of design method information items are stored for taking different types of performance out of a circuit component. Of these design method information items a design method information item is selected according to a requirements specification, when design work is executed using the circuit component. As a result of such arrangement, flexible, resource-reusable design work can be automated using a computer and the number of steps of the design of a high-performance LSI is reduced. In addition, modification method information for modification of circuit data is also stored, so that design knowledge obtained from the design reworking or repetition becomes reusable. The quality of design is improved. Further, circuit component block form information and inter-component block position information are stored in the circuit component storage unit as information descriptive of the layout design of an existing design circuit, to determine a floor plan. As a result, automatic layout becomes possible for resource-reusable design, with the quality of the existing design circuit's layout maintained.

BRIEF DESCRIPTION OF THE DRAWING FIGURES

FIG. 1 is a diagram illustrating the structure of an LSI design automation system in accordance with a preferred embodiment of the present invention.

FIG. 13 is a diagram descriptive of an example of the information stored in a circuit component translation information storage unit of FIG. 11.

FIG. 17 is a diagram descriptive of circuit components entered in a circuit component storage unit of FIG. 16.

DETAILED DESCRIPTION OF THE INVENTION

A preferred embodiment of this invention will now be described below by making reference to the accompanying drawing figures.

FIG. 1 shows an LSI design automation system of the present invention. A circuit component storage unit 111 of FIG. 1 stores a circuit component to collectively control information circuit data, design method information that is applied to the circuit data, and information about the performance and area of a circuit that is implemented by means of application of the design method information.

Figure 2:
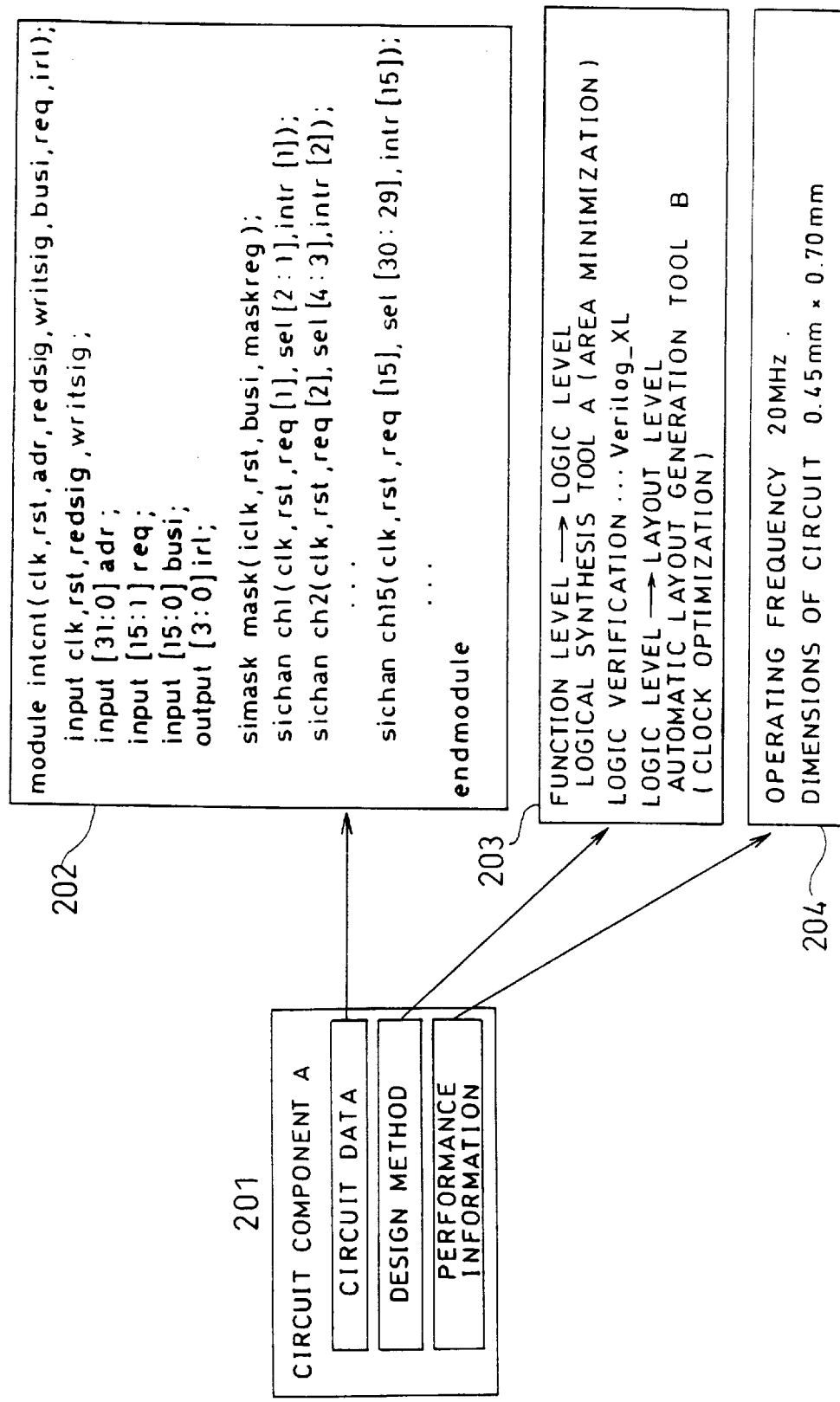
FIG. 2 is a diagram descriptive of a circuit component stored in a circuit component storage unit of FIG. 1.
Figure 3:
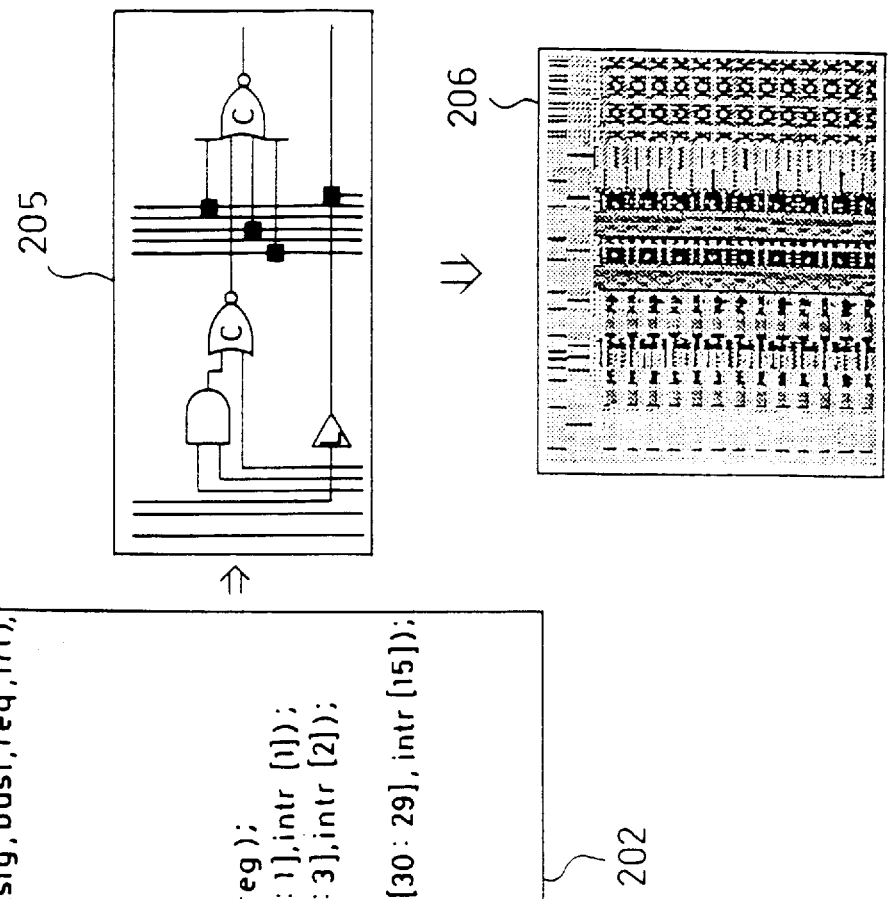
FIG. 3 is a diagram showing an embodiment in accordance with the LSI design automation system of FIG. 1.

Shown in FIG. 2 is an example of the circuit component, i.e., CIRCUIT COMPONENT A. CIRCUIT COMPONENT A, indicated by reference numeral 201, has three different types of information, i.e., circuit data 202, design method information 203, and performance information 204. A design process is executed upon application of the design method information 203 to the circuit data 202, whereupon logic level circuit data 205 and layout circuit data 206 are generated (see FIG. 3). The layout circuit data 206 represents a circuit conforming to the performance information 204.

Figure 4:
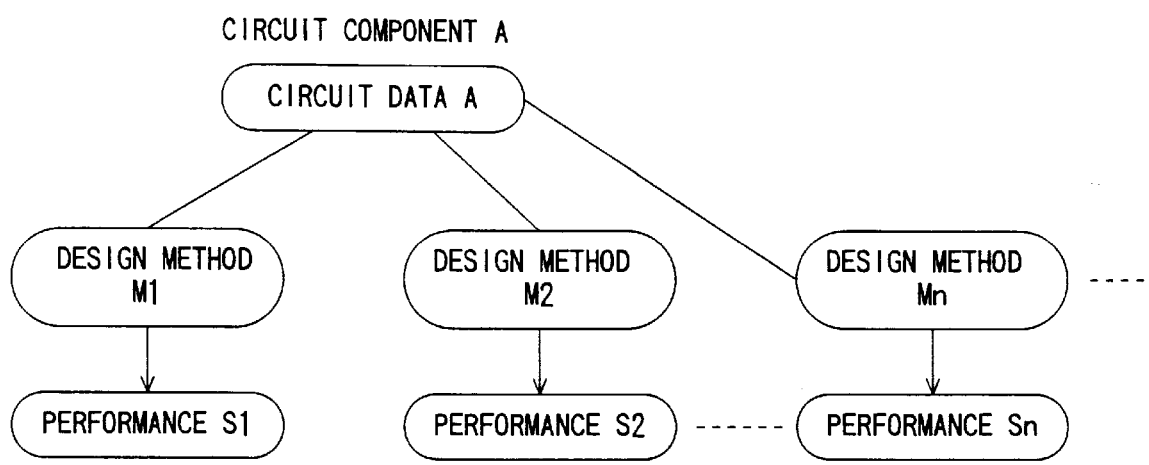
FIG. 4 is a diagram descriptive of a method of storing circuit components in the circuit component storage unit of FIG. 1.

FIG. 4 shows a way of storing circuit components in the component storage unit 111. CIRCUIT COMPONENT A is accompanied with plural design method information items, i.e., DESIGN METHODS M1, M2, M3 . . . and plural performance information items about performances accomplished by circuits generated by applying each design method to the circuit data, i.e., PERFORMANCE INFORMATION S1, S2, S3 . . . The design method information and the performance information are stored in a corresponding fashion. A circuit component, stored in the component storage unit 111 collectively controls the design method information and the circuit component performance information.

An input unit 112, shown in FIG. 1, inputs information necessary for designing a desired LSI. The input unit 112 is made up of a requirements specification input unit 101 and a circuit component configuration input unit 102. The spec input unit 101 inputs information about a requirements specification of the desired LSI. The configuration input unit 102 inputs circuit component configuration information in order to implement an object circuit from the component storage unit 111.

103 is a circuit component selection unit. The component selection unit 103 selects from the component storage unit 111 either a circuit component that conforms to the requirements specification inputted by the spec input unit 101 or a circuit component that conforms to the information inputted by the configuration input unit 102. The circuit component thus selected will be used later. 104 is a design method decision unit. Based on the design method information stored in the component storage unit 111, the method decision unit 104 determines an optimum design method to execute a design process capable of providing an adequate performance conforming to the component selected by the component selection unit 103, to a component modified by a circuit modification unit 106 which will be later described, or to a new circuit component generated by the modification unit 106. The method decision unit 104 further determines a design method for external circuit data.

A design process unit 114 is made up of a design method execution unit 105, a circuit analysis unit 107 and the aforesaid circuit modification unit 106. In the method execution unit 105, the design method determined by the method decision unit 104 is applied to circuit data held by a circuit component and to circuit data modified or generated by the circuit modification unit 106 for design execution. The circuit analysis unit 107 evaluates, for example, a performance and an area implemented by a circuit that is generated using the circuit component selected by the component selection unit 103. The circuit analysis unit 107 extracts information about, for example, a performance and an area implemented by a circuit generated by the method execution unit 105. If the circuit modification unit 106 finds a result of the analysis performed by the circuit analysis unit 107 unconformable to the inputted requirements specification, then either the circuit data and design method held by the circuit component selected by the component selection unit 103 or the circuit generated by the method execution unit 105 is modified to fit the inputted requirements specification.

A component entry unit 115 is made up of a circuit data entry unit 108, a design method entry unit 109, and a circuit performance information entry unit 110. The data entry unit 108 enters into the component storage unit 111 either the circuit data modified or generated by the circuit modification unit 106 as a new circuit component, to generate a circuit conforming to the inputted requirements specification. If the circuit modification unit 106 modifies a design method, the method entry unit 109 enters that modified design method into the component storage unit 111 as an additional design method information item. The circuit generated by the method execution unit 105 is analyzed by the circuit analysis unit 107. A result of the analysis by the circuit analysis unit 107 is delivered to the information entry unit 110. In response, the information entry unit 110 extracts the design method, which is applied in the method execution unit 105, and information about a performance and area, which is implemented by a circuit component according to the design method, by relating them, thereafter entering the extracted information in the component storage unit 111 as a circuit component information item.

116 is an output unit which outputs circuit data generated by the method execution unit 105 and information about, for example, a performance of a circuit analyzed by the circuit analysis unit 107.

Figure 5:
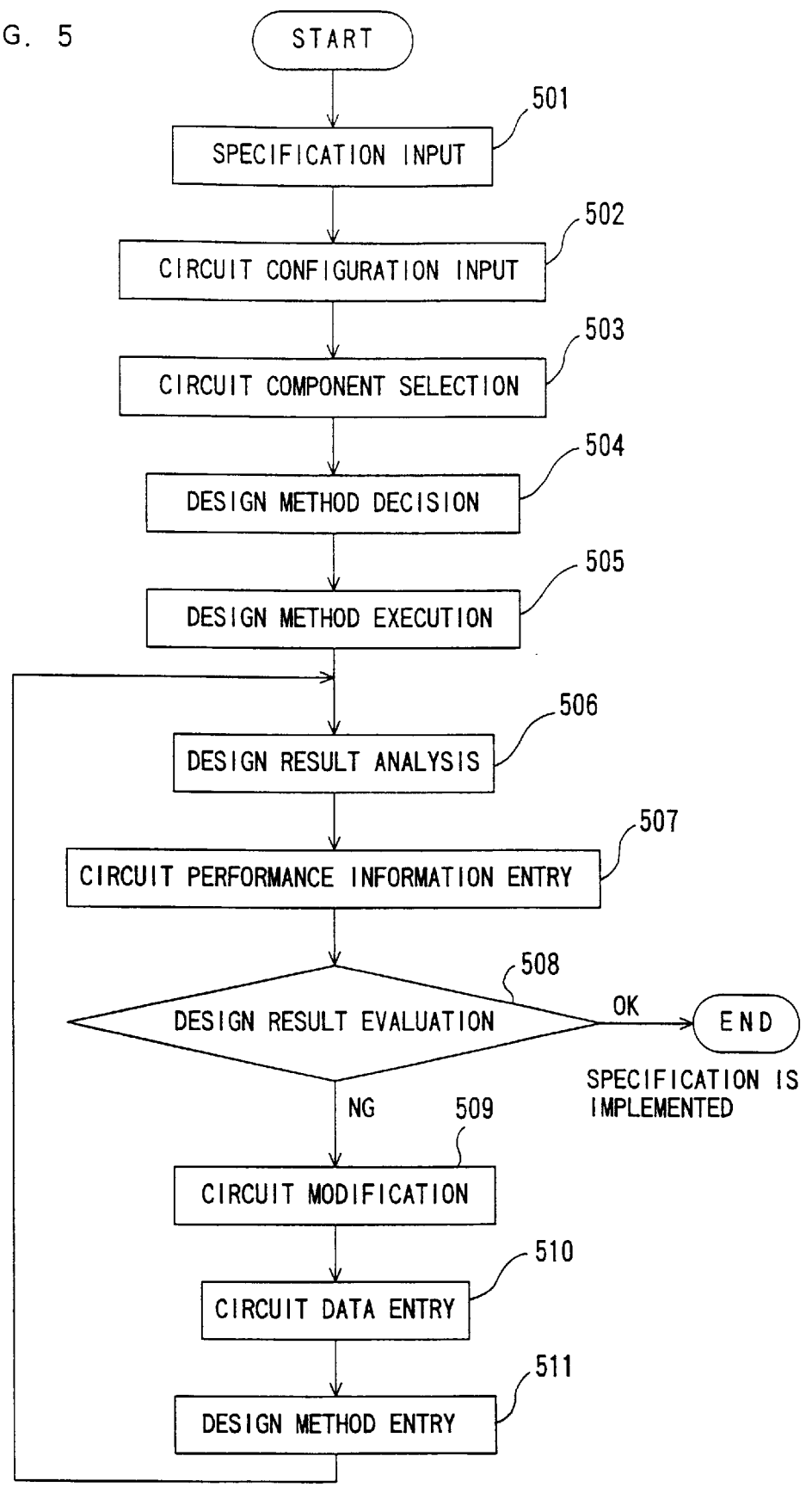
FIG. 5 is a flowchart showing processing steps in the LSI design automation system of FIG. 1.

FIG. 5 is a flowchart showing design processing steps in an LSI design automation system having the above-described structure. A requirements specification is inputted at STEP 501. More specifically, at STEP 501, both information about a performance and information about a function which are implemented by an object circuit are inputted from the spec input unit 101. Next, at STEP 502, circuit configuration information for implementing a circuit conforming to the requirements specification is inputted. Based on the circuit configuration information inputted at STEP 502, STEP 503 selects a circuit component from the circuit components stored in the component storage unit 111. At STEP 504, a design method that is applied to fit the requirements specification is selected from the design methods held by the circuit component, on the basis of performance information corresponding to such a selected design method. At STEP 505, by application of the selected design method to each component data, an actual circuit design process is executed to generate a circuit. The generated circuit is analyzed at STEP 506, and information about a performance that is implemented by the generated circuit is extracted. At STEP 507, the extracted information is entered in the component storage unit 111 as circuit component information for the circuit component from which the circuit is generated, together with the applied design method. At STEP 508, the information extracted at STEP 506 is compared with the requirements specification, in order to perform an evaluation to determine whether the generated circuit conforms to the requirements specification. If the generated circuit is a circuit that fits the specification, then the design work is completed. On the other hand, if the generated circuit is a circuit that does not fit the specification, then a modification is made to the generated circuit at STEP 509. If a modification is made to circuit data held by a circuit component at STEP 509, then such modified circuit data is entered in the component storage unit 111 as a new circuit component at STEP 510. If generation circuit data is modified at STEP 509, then at STEP 511 a design method used for such a modification is extracted and stored in the component storage unit 111 as circuit component information, together with the modified circuit data.

In accordance with the present LSI design automation system, STEP 509, STEP 506, and STEP 508 are repeatedly performed until a circuit conforming to the requirements specification is generated. During these steps, the contents of a modification made and information regarding circuit performance implemented by such a modification can be stored as a circuit component by STEPS 507, 510, and 511. Such a newly stored circuit component can be reused later.

Accordingly the more the present LSI design automation system performs design work, the more circuit components the component storage unit 111 stores. Therefore, the LSI design automation can be performed with broad flexibility at high efficiency.

Figure 6A:
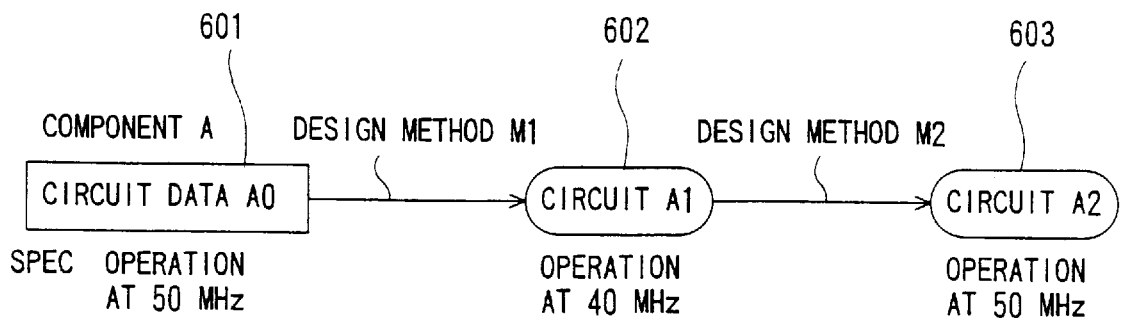
FIGS. 6A and 6B are diagrams each showing a way of storing information about modification of a design method in the LSI design automation system of FIG. 1.
Figure 6B:
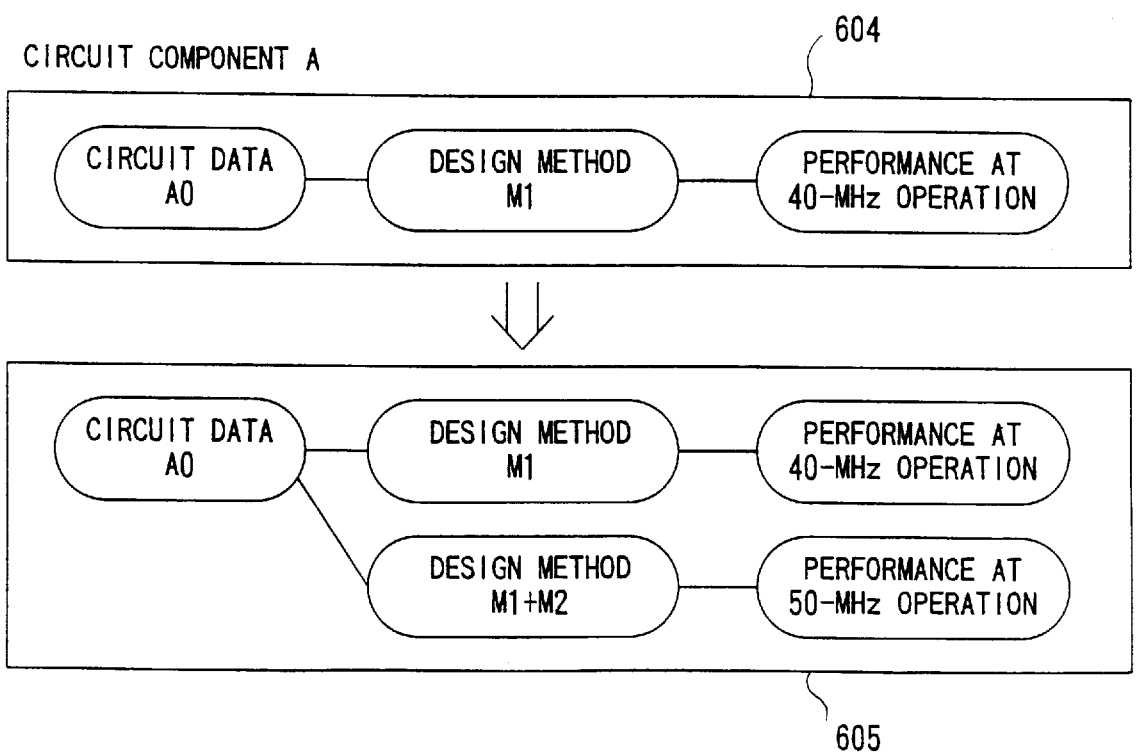

Referring now to FIGS. 6A and 6B, a way of storing design method modification information is described below. As a requirements specification, information specifying a 50-MHz operation is first provided. Then, CIRCUIT COMPONENT A is selected. CIRCUIT COMPONENT A holds INFORMATION 604. DESIGN METHOD M1 is applied to CIRCUIT DATA A0 (601), whereupon CIRCUIT A1 (602) is generated. CIRCUIT A1 is analyzed and information indicating that CIRCUIT A1 has the ability of operating at an operating frequency of 40 MHz is extracted. The requirements specification (i.e., the 50-MHz operation) is compared with the performance of CIRCUIT A1 (i.e., the 40-MHz operation) and CIRCUIT A1 is found unconformable to the requirements specification. CIRCUIT A1 is modified to generate CIRCUIT A2 (603). Extracted from such an executed modification is DESIGN METHOD M2. These DESIGN METHODS M2 and M1 are combined and entered as a circuit component information data item. CIRCUIT A2 is analyzed and information indicating that CIRCUIT A2 has the ability of operating at an operating frequency of 50 MHz is extracted. This extracted information is written in the component storage unit 111 as an information item for CIRCUIT COMPONENT A. The performance of CIRCUIT A2 is compared with the requirements specification. CIRCUIT A2 is found conformable to the requirements specification and the design work is completed. CIRCUIT COMPONENT A now holds INFORMATION 605 in addition to INFORMATION 604.

Figure 7A:
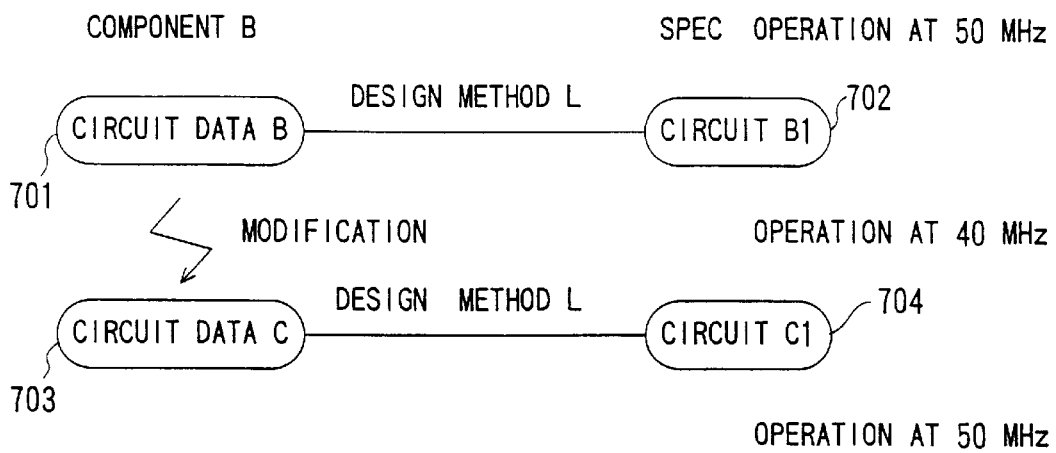
FIGS. 7A and 7B are diagrams each showing a way of storing information for modification of circuit data.
Figure 7B:
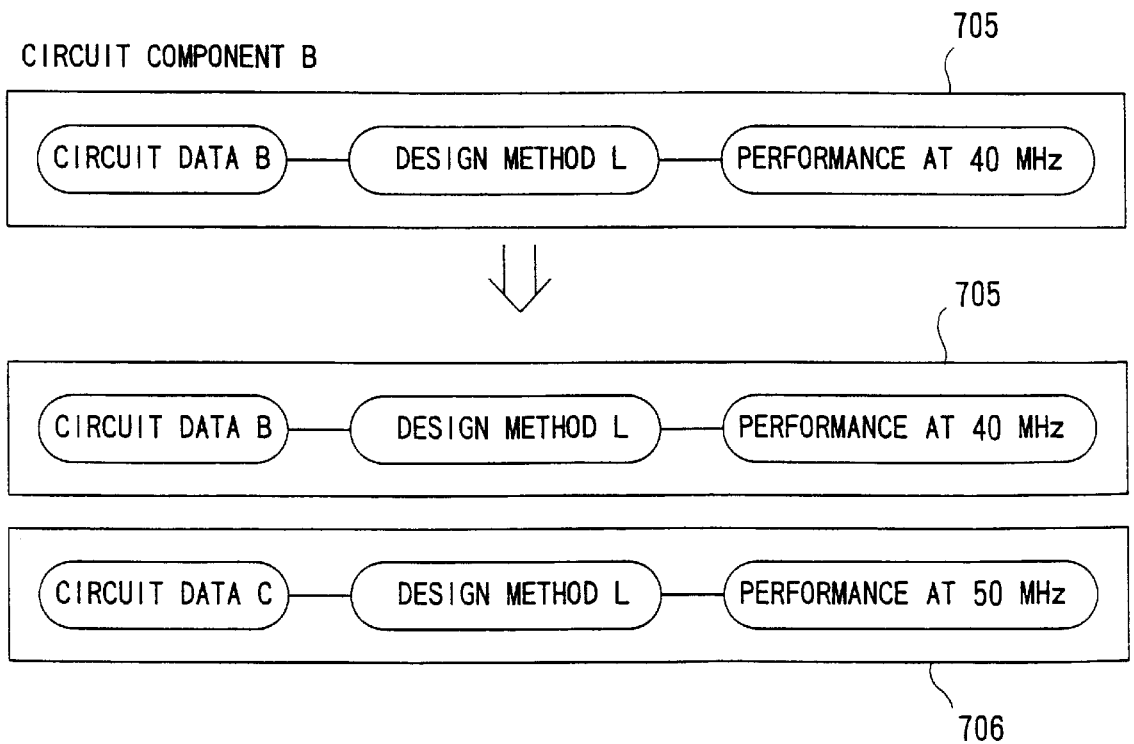

Referring now to FIGS. 7A and 7B, a way of storing circuit data modification information is described below. As a requirements specification, information specifying a 50-MHz operation is first provided. Next, CIRCUIT COMPONENT B is selected. CIRCUIT COMPONENT B holds INFORMATION 705. In accordance with DESIGN METHOD L, CIRCUIT B1 (702) having the ability of operating at an operating frequency of 40 MHz should be generated from circuit data B (701). In other words, CIRCUIT B1 does not conform to the requirements specification. Accordingly, CIRCUIT DATA B is modified to generate CIRCUIT DATA C (703). Next, CIRCUIT DATA C is stored in the component storage unit 111 as circuit data for a new circuit component, i.e., CIRCUIT COMPONENT 706. DESIGN METHOD L, which is applied to CIRCUIT DATA B, is stored in the component storage unit 111 as an information item about CIRCUIT COMPONENT 706. DESIGN METHOD L is applied to CIRCUIT DATA C to generate CIRCUIT C1 (704). Next, CIRCUIT C1 is analyzed, and information indicating that CIRCUIT C1 has the ability of operating at an operating frequency of 50 MHz is extracted. Such performance information indicative of a 50-MHz operation is stored in the component storage unit 111 as performance information for CIRCUIT COMPONENT 706. The requirements specification is compared with the performance of CIRCUIT C1, and the requirements specification is confirmed to be met. Then, the design work is completed. As shown in FIG. 7B, after the design work is completed, there is an addition, i.e., CIRCUIT COMPONENT C.

Figure 8:
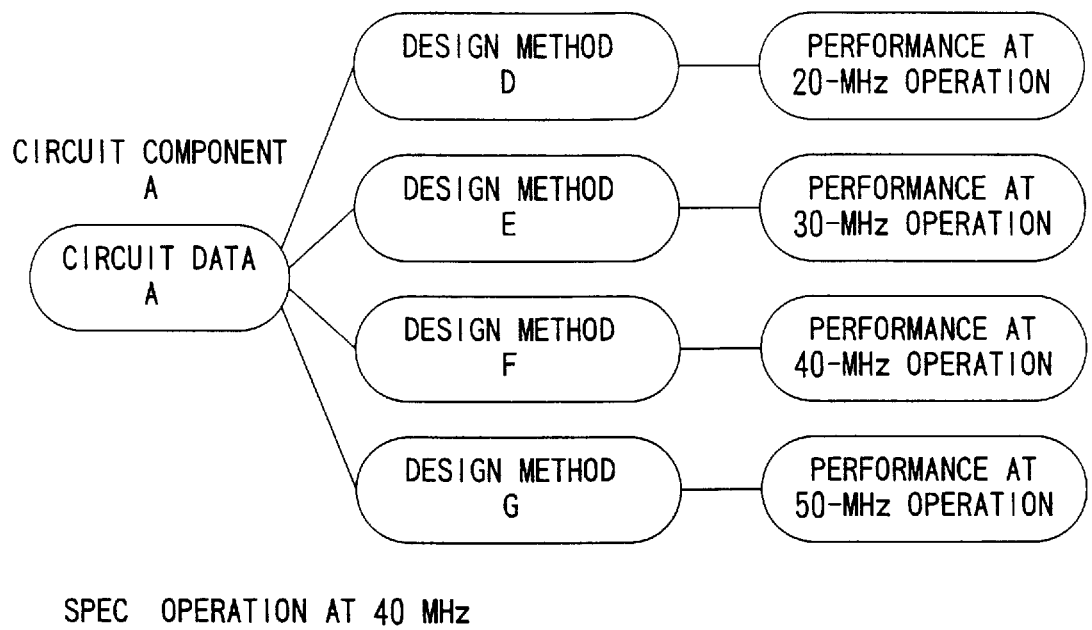
FIGS. 8A and 8B are diagrams each showing a way of determining a design method in the LSI design automation system of FIG. 1.
Figure 8:

Referring to FIGS. 8A and 8B, a way of determining a design method is now described. First, information specifying a 40-MHz operation is provided as a requirements specification. Then, CIRCUIT COMPONENT A is selected. The inputted specification is analyzed to extract information about a performance that is implemented by CIRCUIT COMPONENT A. Here, suppose that information descriptive of a 40-MHz operation is extracted. Such extracted information is compared with performance information held by each circuit component. Next, based on the performance information compare result, DESIGN METHOD F capable of implementing a 40-MHz operation is selected. As shown in FIG. 8B, DESIGN METHOD F is applied to CIRCUIT DATA A to generate CIRCUIT AF.

A case is described in which an LSI design is executed by making use of input circuit data that is not stored in the component storage unit 111. First, a search is made through the component storage unit 111 to find a circuit component that holds circuit component data similar to that inputted circuit data. The LSI design is performed using a design method and component performance information held by the circuit component thus found. A way of determining a design method in such a case is described by making reference to FIGS. 9A to 9C. First, as a requirements specification, INFORMATION 905 descriptive of circuit characteristics (e.g., operating frequency and circuit area) is inputted. CIRCUIT DATA 901 is inputted. CIRCUIT DATA 901 is analyzed and data type information, function information, design method information estimated from the data type information, and circuit scale information estimated from the circuit data information are extracted. The circuit component is analyzed and data type information, function information, design method information, and circuit scale information are extracted. In this case, CIRCUIT COMPONENTS 903, 904 are analyzed and data type information (e.g., a logical drawing), function information (e.g., a multiplier), design method information, and information descriptive of an operating frequency, circuit area, and circuit scale implemented by means of execution of a design method specified by the design method information. A result of the circuit data analysis is compared with a result of the circuit component data analysis and CIRCUIT COMPONENT B (904) is selected. Next, the inputted information is analyzed, and operating frequency information and circuit area information are extracted. INFORMATION 905, i.e., a requirements specification, is extracted. Information about a performance that is implemented by the selected circuit component is compared with the extracted requirements specification, and an optimum design method is selected from design methods held by CIRCUIT COMPONENT B. DESIGN METHOD B2 which fits INFORMATION 905 is selected. DESIGN METHOD B2 is performed on CIRCUIT DATA 901. As a result, a layout conforming to the requirements specification is generated (see FIG. 9C).

Figure 9:
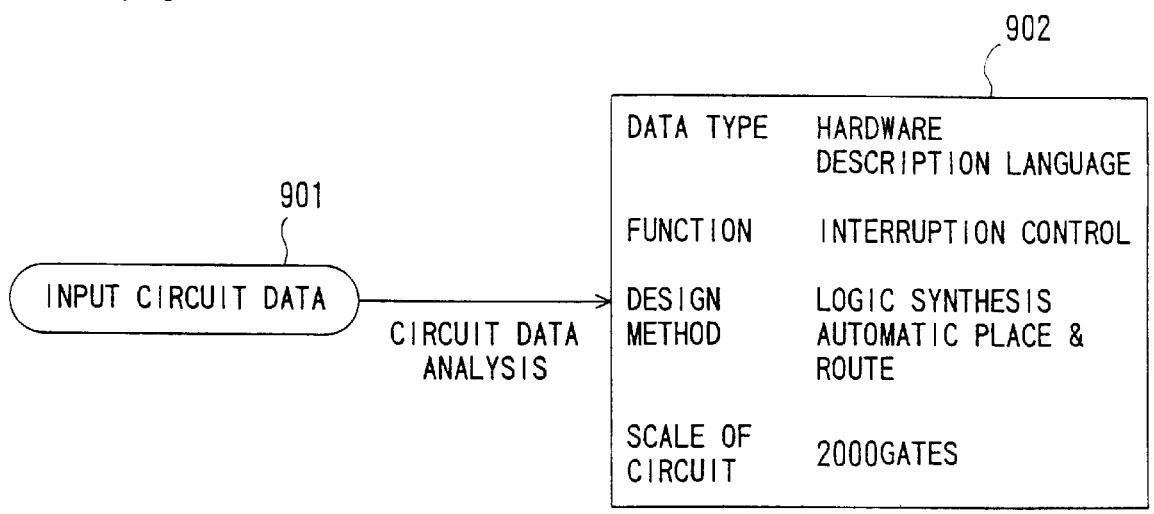
FIGS. 9A to 9C are diagrams each showing a way of determining a design method in the LSI design automation system of FIG. 1.
Figure 9:
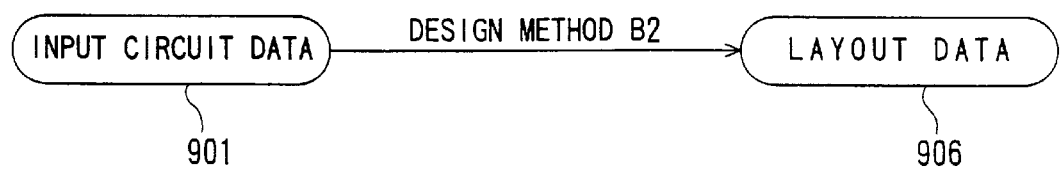
Figure 9:
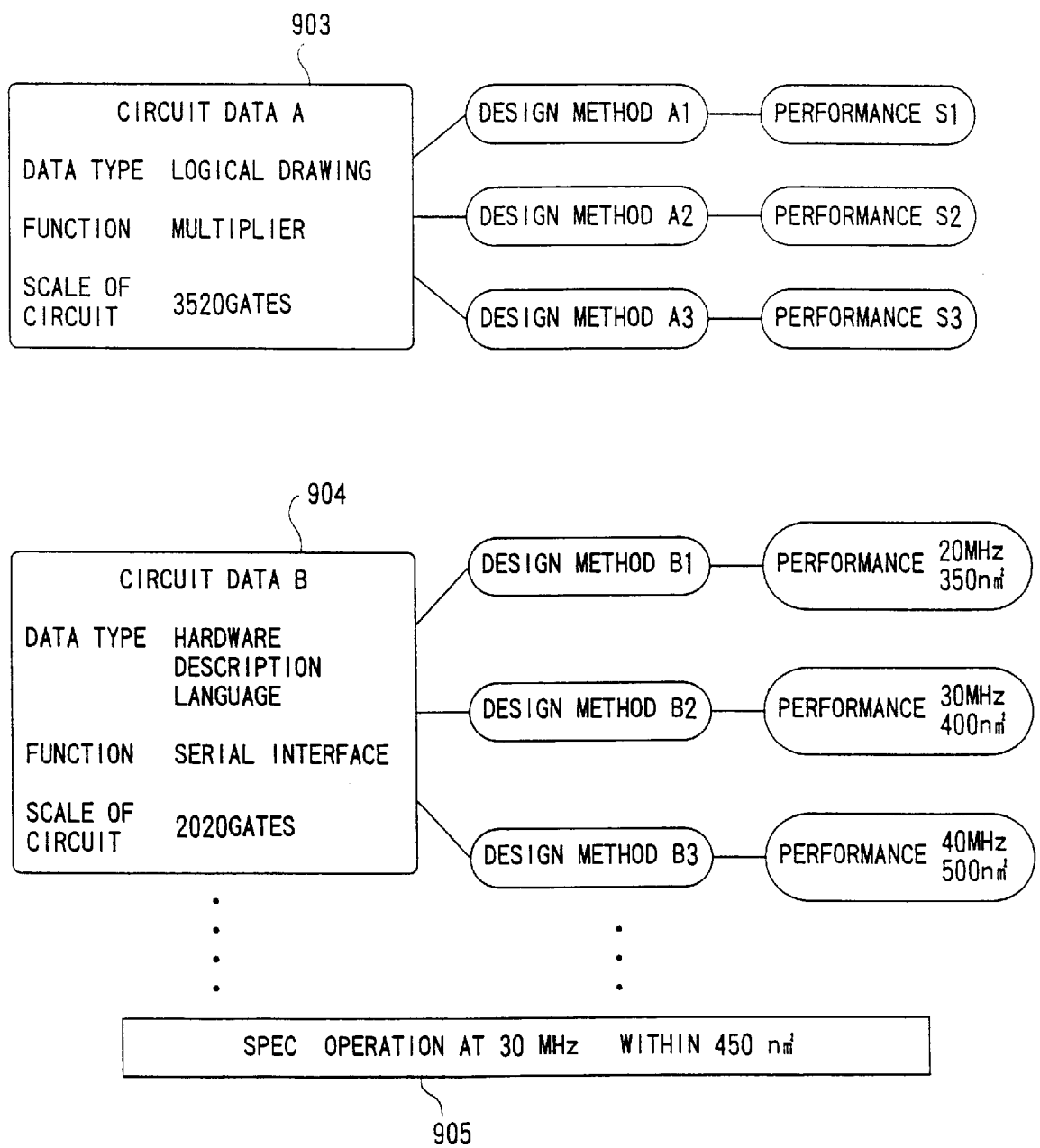
Figures 10A, 10B:
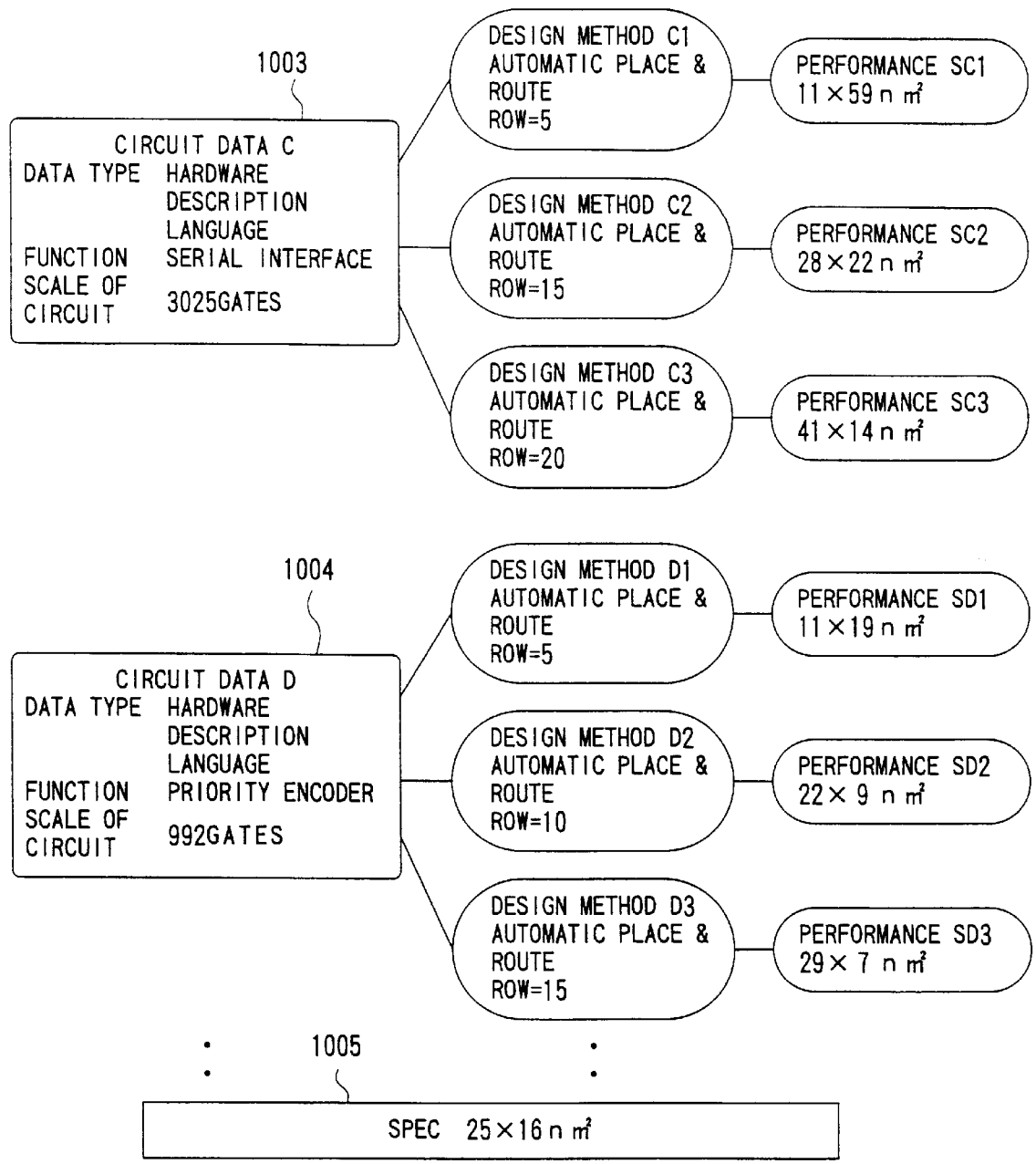
FIGS. 10A and 10B are diagrams each showing a way of determining a design method in the LSI design automation system of FIG. 1.

A case is explained in which no design methods are found to implement a desired performance. An analysis is made by relating design methods and component performance information stored in the circuit component storage unit 111. A component performance corresponding to a design method is evaluated for deriving a design method capable of implementing the desired performance. The derived design method is utilized to carry the design work forward. If new circuit data is inputted, a design method capable of fitting a desired performance is derived to carry the design work forward. An example of the above-described design method decision method is explained by making reference to FIGS. 10A and 10B. INFORMATION 1005, i.e., a requirements specification, is inputted. As is shown in FIG. 9A, CIRCUIT DATA 901 is inputted. CIRCUIT DATA 901 is analyzed, and INFORMATION 902, comprising data type information, function information, design method information estimated from the data type information, and circuit scale information estimated from the circuit data information, is extracted. The circuit component is analyzed and data type information, function information, design method information, and circuit scale information are extracted. In this case, CIRCUIT COMPONENTS 1003 and 1004 are analyzed, and data type information (e.g., a hardware description language), function information (e.g., a serial interface), a design method, and information descriptive of a circuit scale, circuit area, and form implemented by means of execution of the design method are extracted. This is followed by selecting a design method applicable to CIRCUIT DATA 902 from the circuit component storage unit 111. At the same time, information about a performance that is implemented by means of application of the selected design method is also selected. The circuit area and form changes as the number of rows of standard cells changes. Therefore, parameters for executing an automatic layout generating tool according to design methods held by CIRCUIT COMPONENTS 1003 and 1004 are selected by relating information descriptive of the number of rows and information descriptive of a resultant circuit form, as a design method information item. Then, the statistical processing of a design method held by a circuit component and information about a circuit performance that is implemented by means of execution of such a design method is performed. In this case, the relationship of the circuit scale versus the circuit area is defined using information held by CIRCUIT COMPONENTS 1003 and 1004, and the relationship of the row count versus the circuit form (i.e., the circuit longitudinal length) is defined as a parameter. Based on these two relationships thus defined, circuit scale information and circuit form information are provided. This can automatically determine a design method for implementing them. For CIRCUIT COMPONENTS 1003 and 1004, the circuit area, S, can be approximated by: $S=0.2\times$the number of gates. The circuit longitudinal length, H, can be approximated by: $H=2\times$the number of rows. From this relationship, a formula can be generated which is used to find the circuit lateral length. The number of rows according to the requirements specification can be fixed by determining circuit scale information. Next, the inputted requirements specification is analyzed, and circuit area information and circuit form information are extracted. In this case, INFORMATION 1005 is extracted. Based on a relationship derived from the aforesaid statistical processing, the number of rows is determined at 13. Using such a result (i.e., the number of rows is 13) as a design method information item, DESIGN METHOD 1006 is derived. If DESIGN METHOD 1006, which is derived for CIRCUIT DATA 901, is executed, this generates a layout conforming to the requirements specification.

A least squares method or other statistical process methods may be used to derive a relationship between the area and the gate count or a relationship between the number of rows and the cell length in its height direction. Additionally, a design method may be derived from various relationships such as a relationship between the parameter for logic synthesis and the number of gates.

Figure 11:
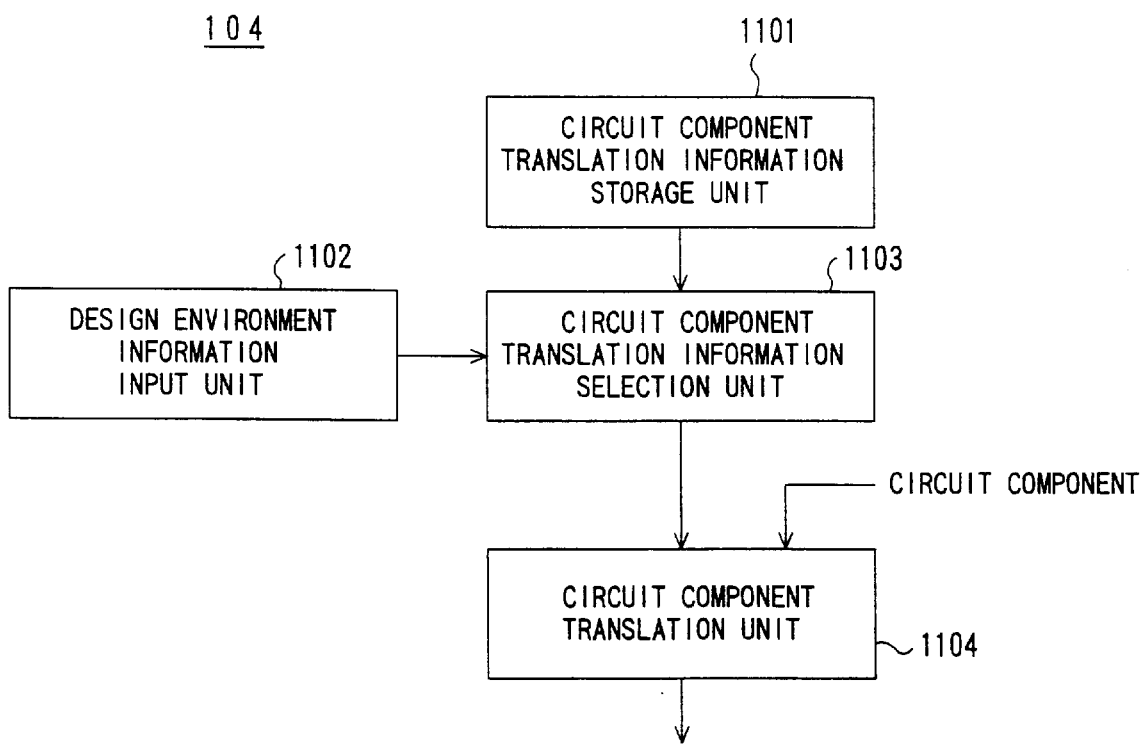
FIG. 11 is a diagram depicting an embodiment of a design method decision unit of FIG. 1.

FIG. 11 shows an example of the design method decision unit 104. By making reference to FIG. 11, an LSI design automation system is described which uses circuit component translation information for performing a circuit component translation according to the change in the design environment.

Figure 12:
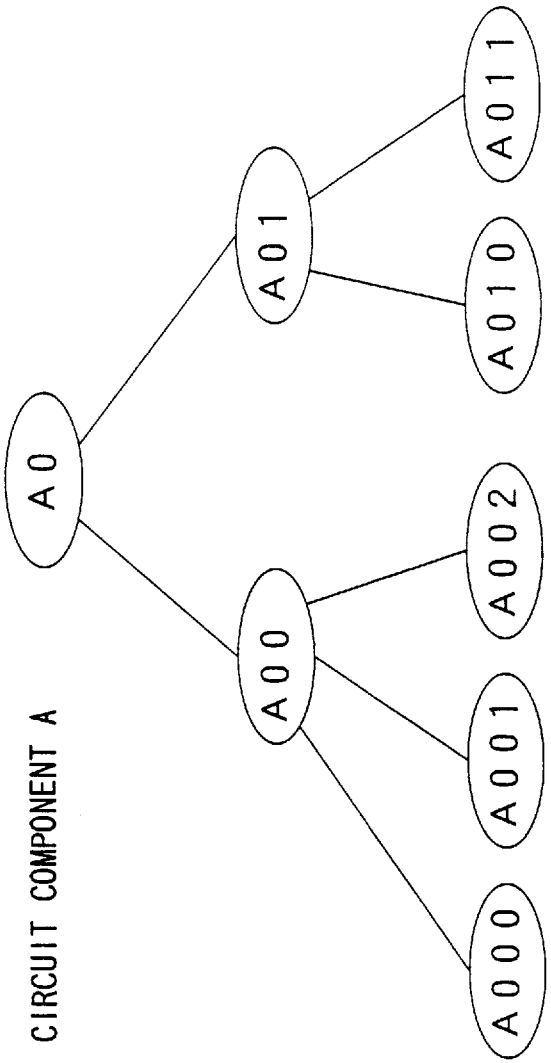
FIG. 12 is a diagram descriptive of a way of storing circuit components in an LSI design automation system incorporating thereinto the design method decision unit of FIG. 11.

The circuit component storage unit 111 of FIG. 1 collectively stores circuit data in a hierarchical structure shown in FIG. 12, a design method that is applied to the circuit data, and information about a circuit performance that is implemented by applying the design method to the circuit data. The circuit component selection unit 103 selects from the circuit component storage unit 111 a circuit component necessary for implementing an object circuit.

A circuit component translation information storage unit 1101 of FIG. 11 stores circuit component translation information for performing a circuit component translation according to the design environment change. An example of the circuit component translation information is illustrated in FIG. 13. In this example, a change in the process technology is defined, i.e., a process rule change from 1.2 $\mu$m to 0.8 $\mu$m. Because of such a technology change, the circuit data translation and the design method change are defined in the circuit component translation information as shown in FIG. 13. The circuit data includes the following: function level data independent of the technology, logic level data according the technology, and layout level data according to the technology. With regard to the logic level data, a cell name replacement process is performed. In other words, if one cell has different names by technologies although its function is the same, then such a cell name replacement process is performed. Additionally, a path change is made to a library that is referred to and the like is performed. With regard to the layout data, a technology translation tool A capable of automatic layout technology translation is executed to implement a translation to a circuit component that is reusable with different technologies. With regard to the design method change, a technology-dependent library change is made. In this case, a logic synthesis tool is executed by changing the library from B to C, and a logic verification tool is executed by changing the library from D to E. Such a library change is implemented by changing parameters used for execution of each tool. A change in a design tool that is used according to a new technology is made. In this case, the automatic layout generating tool is changed from F to G, according to which execution parameters are changed. Further, information about execution parameters held by each circuit component is collectively changed for implementing an optimum design. Each design tool is assigned a respective priority so that they are applied in order, in preparation for a change to a different design tool, and the design method change process is completed.

A design environment information input unit 1102 of FIG. 11 inputs design environment information about a design tool, technology, and library which are used during the design of the object circuit. 1103 is a circuit component translation information selection unit. This selection unit 1103 selects a circuit component translation information item from the circuit component translation information storage unit 1101, to generate a circuit component conforming to the design environment information inputted by the input unit 1102. 1104 is a circuit component translation unit. This translation unit 1104 applies the aforesaid circuit component translation information selected by the selection unit 1103, to a circuit component selected by the selection unit 103 to form the object circuit, and translates such a circuit component into one corresponding to information about a new design environment. In this case, in order to associate with a new design rule, the FIG. 13 circuit component translation information is applied to a circuit component with a hierarchical structure of FIG. 12, and changes in the circuit data, design method, and information about a circuit performance to be implemented are made. With regard to the FIG. 12 circuit component in a hierarchical structure, the aforesaid circuit component translation information is applied to each circuit component in an order of priority, that is, from high-order to low-order. The circuit component translation processing is completed.

Figure 14:
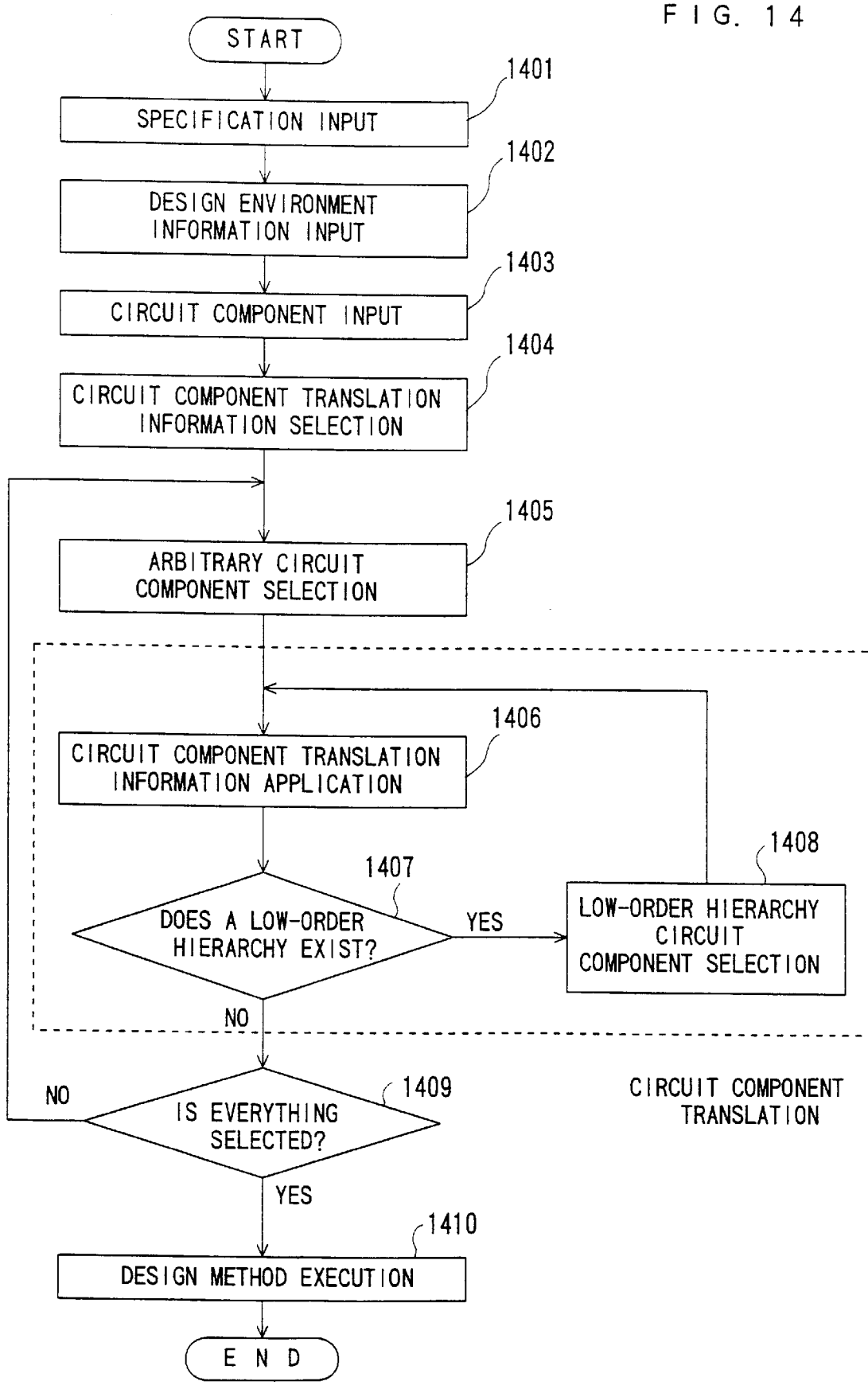
FIG. 14 is a flowchart showing processing steps in an LSI design automation system incorporating thereinto the design method decision unit of FIG. 11.

FIG. 14 is a diagram flowcharting design processing in an LSI design automation system incorporating therein the design method decision unit 104 of FIG. 11. At STEP 1401, information about a function and a performance that is implemented is inputted. At STEP 1402, information about a design environment to be applied in the design generation is inputted. More specifically, design tool change information and library change information are inputted. At STEP 1403, a circuit component necessary for implementing the object circuit is selected and inputted from the storage unit 111. At STEP 1404, a circuit component translation method for implementing a circuit component conforming to the aforesaid design environment information inputted at STEP 1402 is selected from the storage unit 111. At STEP 1405, a single circuit component is arbitrarily selected from the circuit components inputted at STEP 1403. At STEP 1406, the circuit component translation method selected at STEP 1404 is applied to the circuit component selected at STEP 1405, to generate a circuit component corresponding to the input design environment information. At STEP 1407, a decision is made to determine whether the translated circuit component of STEP 1406 has a subordinate circuit component. If STEP 1407 says "YES", this causes such a subordinate circuit component to be selected at STEP 1408. Next, at STEP 1406, the circuit component translation information selected at STEP 1404 is applied to the selected subordinate circuit component for implementing subordinate circuit component translation. STEP 1407 is repeated and the translation processing of all the circuit components selected at STEP 1405 is completed. At the time when no subordinate circuit components are determined to exist, STEP 1409 makes a judgement to determine whether every circuit component inputted at STEP 1403 is selected at STEP 1405.

If the result of STEP 1409 is "NO", the program returns to STEP 1405. On the other hand, if STEP 1409 says "YES", the program goes to STEP 1410. STEP 1410 applies, to circuit data held by an already translated circuit component, a design method held by the same. This enables circuit generation conforming to a requirements specification, under new design rules.

Suppose that specific circuit component translation information is applied to CIRCUIT COMPONENT A. Referring to FIG. 12, it is understood that this translation information is first applied to A0 located at the highest position in a hierarchy. Circuit data translation, design method translation, and component performance information translation are carried out if necessary. This is followed by application of the translation information to A00 and to A01. A00 and A01 together make up A0. Likewise, circuit data translation, design method translation, and component performance information translation are carried out if necessary. In this way, the circuit component translation information is applied in sequence to all the circuit components in the hierarchy. This implements a resource-reusable design technique by making use of circuit components, taking into no consideration the change in the design environment. The circuit component translation information is information which is generated at the time when a change is made to the design environment after a circuit component is generated and which is applicable to every circuit component. Common use of the circuit component translation information among all the circuit components is preferable for efficient storage purposes. In other words, it is preferable that all the circuit components do not hold their respective circuit component translation information.

Accordingly, the circuit component translation information allows design generation using common components to be executed in cases where various design tools are employed, taking into no consideration the differences between the design tools. If the correlation between the execution parameter for each design tool and the performance to be implemented is expressed by a relation formula, this allows a desired performance to be implemented even if a change is made to the design environment. Additionally, circuit components generated according to various technologies can be reused, ignoring the existence of those technologies. Further, a circuit component can be designed, ignoring a technology that exists behind the circuit component. Furthermore, a circuit formed by a mixture of circuit components generated by different technologies can be designed, ignoring these technologies that exist behind the circuit components. Additionally, the circuit component translation information is prepared according to translation information common among all of the circuit components, thereby facilitating the storage of the circuit component translation information and the application of the circuit component translation information to the circuit components.

In the above-described embodiment, information about a specific design environment is inputted from outside, and design automation associated with the change in the design environment is explained. The design environment changes with the circuit performance implemented by the circuit component. If a change in the circuit performance is so expressed that it can be evaluated, this automatically selects information about a design environment for generating a circuit capable of fitting a requested specification. This provides a more effective resource-reusable design technique.

Figure 15:
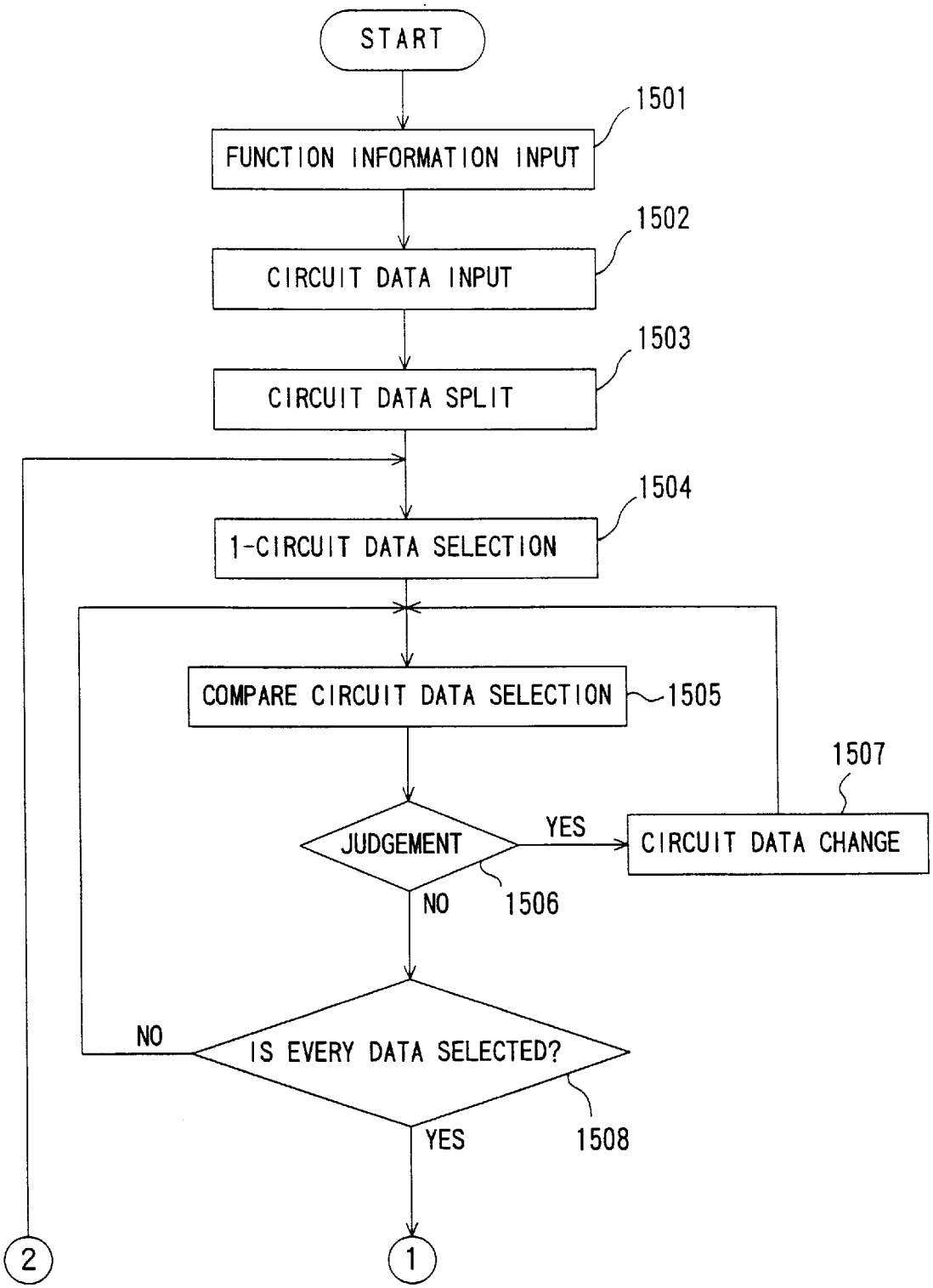
FIGS. 15A and 15B are flowcharts jointly showing capsulization steps of circuit data and steps of entering circuit components.
Figure 15B:
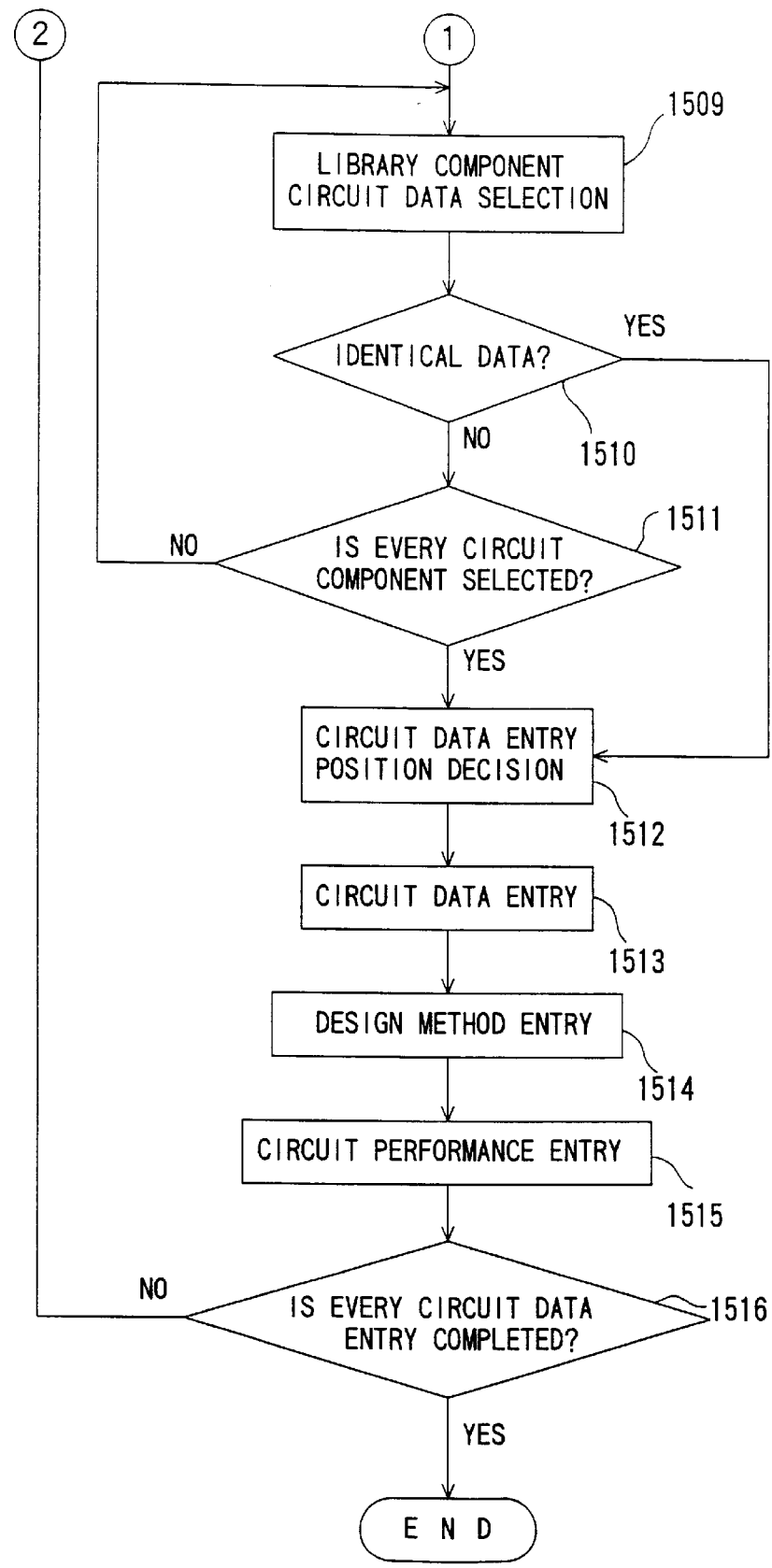

FIGS. 15A and 15B are diagrams jointly showing a way of capsulizing circuit data and a flow of entering circuit components in an LSI design automation system incorporating therein the design method decision unit 104 of FIG. 11. At STEP 1501, information about a function that is implemented by a circuit that is entered as a circuit component is inputted. The inputted function information enables post-entry reuse. At STEP 1502, circuit data to be entered as a circuit component is inputted. At STEP 1503, the circuit data inputted at STEP 1502 is divided into plural items on the basis of the function information and the design method information. Basically, circuit data is divided according to its hierarchy structure. However, circuit data has in part a new hierarchy structure to accomplish flexible reuse and to implement high-performance design.

The circuit data is actually capsulated and entered. In this case, the processing of entry begins with circuit data located at higher positions in the hierarchy. At STEPS 1504 to 1508, circuit data in a higher position is selected. At STEP 1504, a circuit data item of the circuit data items divided at STEP 1503 is selected at random. Assume that this selected circuit data item is one located at a higher position in the hierarchy. At STEP 1505, data other than the circuit data selected at STEP 1504 is selected. Such data selected at STEP 1505 acts as compare circuit data. STEP 1506 determines whether the compare circuit data is hierarchically located above the circuit data selected at STEP 1504. If STEP 1506 says "YES", the compare circuit data is replaced with the circuit data at STEP 1507. The program then returns back to STEP 1505 to select one from unselected circuit data and the selected one acts as new compare data. On the other hand, if STEP 1506 says "NO", the program goes to STEP 1508 to determine whether every circuit data is selected at STEP 1505. If STEP 1508 says "NO", the program returns to STEP 1505 to select one from unselected circuit data and the selected one acts as new compare data. On the other hand, if STEP 1508 says "YES", circuit data that is now at a higher position in the hierarchy is defined as high-order hierarchy circuit data and the subsequent processes will be executed. The choice of high-order hierarchy circuit data is completed by means of execution of STEPS 1504 to 1508.

At STEP 1509, the choice of library component circuit data stored in a circuit component library is made. At STEP 1510, a judgment is made to determine whether the aforesaid high-order hierarchy circuit data is identical with the library component circuit data selected. If they are found identical with each other, then the program goes down to STEP 1512. At STEP 1512, the high-order hierarchy circuit data is entered to at the same address that the library component circuit data is stored. Conversely, if STEP 1510 says "NO", the program proceeds to STEP 1511. At STEP 1511, a judgment is made to determine whether or not all the library component circuit data are selected at STEP 1509. If STEP 1511 says "NO", this causes STEP 1509 to select circuit data to execute the subsequent processes. On the other hand, if STEP 1511 says "YES", then STEP 1512 determines where to enter the aforesaid high-order hierarchy circuit data, i.e., a new circuit component.

Next, at STEP 1513, the aforesaid high-order hierarchy circuit data is written to the entry location determined at STEP 1512, as circuit data. In this case, if circuit data to be entered is the highest in the hierarchy (i.e., the first data to be entered), then the function information inputted at STEP 1501 is entered as a circuit component information item. If the circuit data has a hierarchical structure, information about such a structure is also entered as a circuit component information item. More specifically, information descriptive of a name given to a low-order hierarchy circuit held by the circuit data is entered. The circuit component may hold circuit data itself. However, it is preferable that the circuit component holds only information about where the circuit data is located, thereby preventing circuit data duplication. Circuit component storage can be exerted at high efficiency.

At STEP 1514, a design method that is applied to the aforesaid high-order hierarchy circuit data is entered as a circuit component information item. Further, at STEP 1515, information, which is about a circuit performance that is implemented by applying the design method to the high-order hierarchy circuit data, is entered as an information item for the aforesaid circuit component. Next, STEP 1516 determines whether all the divided circuit data items of STEP 1503 have been entered. If STEP 1516 says "NO", this causes the program to return to STEP 1504. At STEP 1504, a circuit that has not been entered yet as a circuit component is selected and the subsequent processes are repeatedly executed until the entry of every circuit data is completed. Upon completion of the entry of every circuit data, the circuit data capsulization and the entry thereof to the circuit component library are completed.

In accordance with the present LSI design automation system, a circuit component is selected from circuit components prepared for implementing a desired function. A combination of such selected circuit components produces a new function. Further, for each of the selected circuit components to conform to a requirements specification, a design method held by each circuit component is reused. If a requirements specification is not satisfied by making reuse of existing design methods, circuit data modification, design method modification, and the like are executed for fitting the requirements specification.

Additionally, if such a modification is made, then the present LSI design automation system will learn a way of how the modification has been made. Such learning is stored as new circuit data and as a new design method and is reused later.

Furthermore, the aforesaid circuit component combination and design method information are optimum to implement a desired function. Information descriptive of a target function, a circuit component combination capable of implementing the target function, a design method used for each component, and information descriptive of a circuit performance that is implemented by the design method, are stored and reused, so that an object circuit can be implemented by inputting only a desired function and performance.

Figure 16:
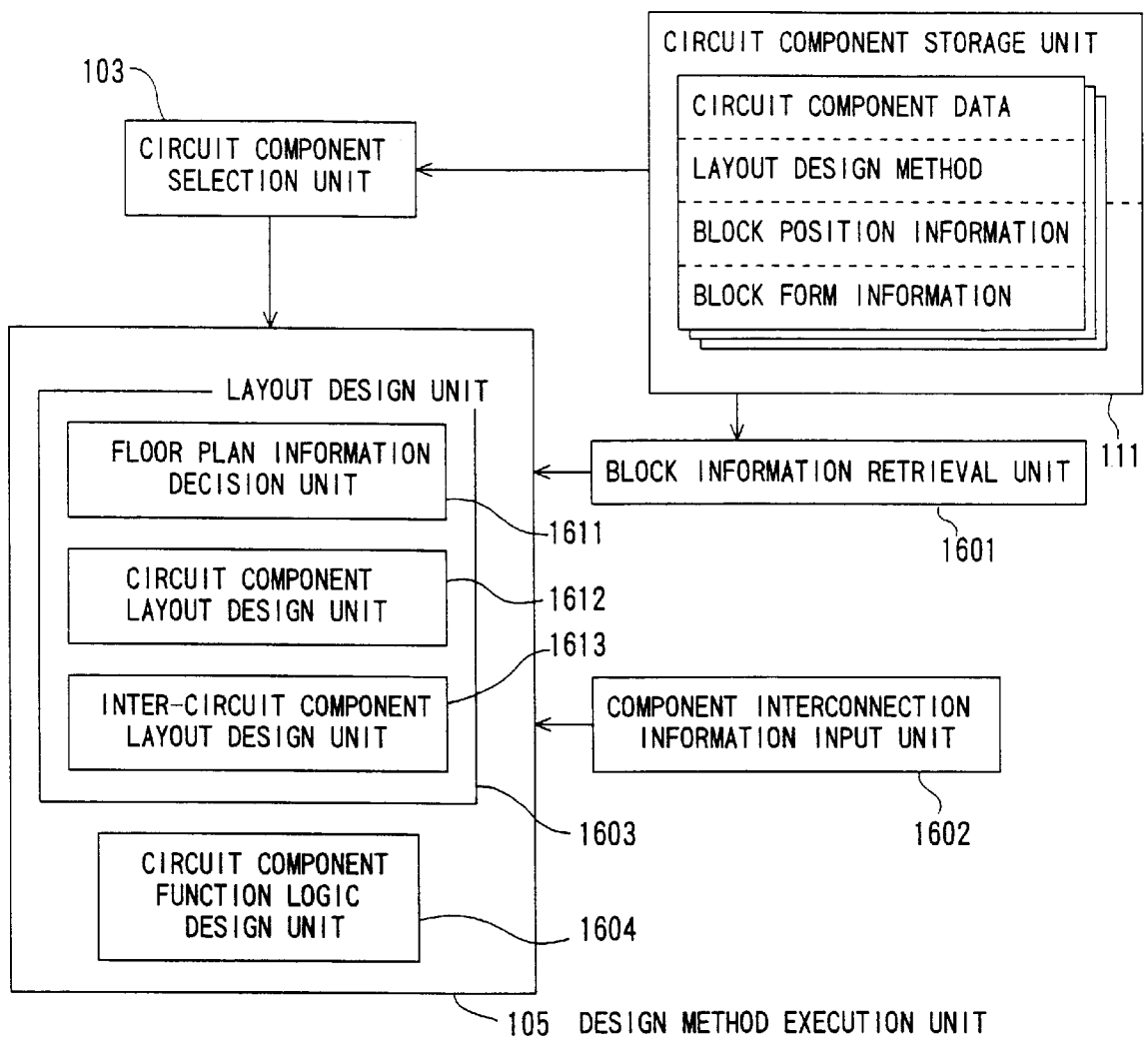
FIG. 16 is a diagram illustrating the structure of a revision of the LSI design automation system of FIG. 1.
Figure 18:
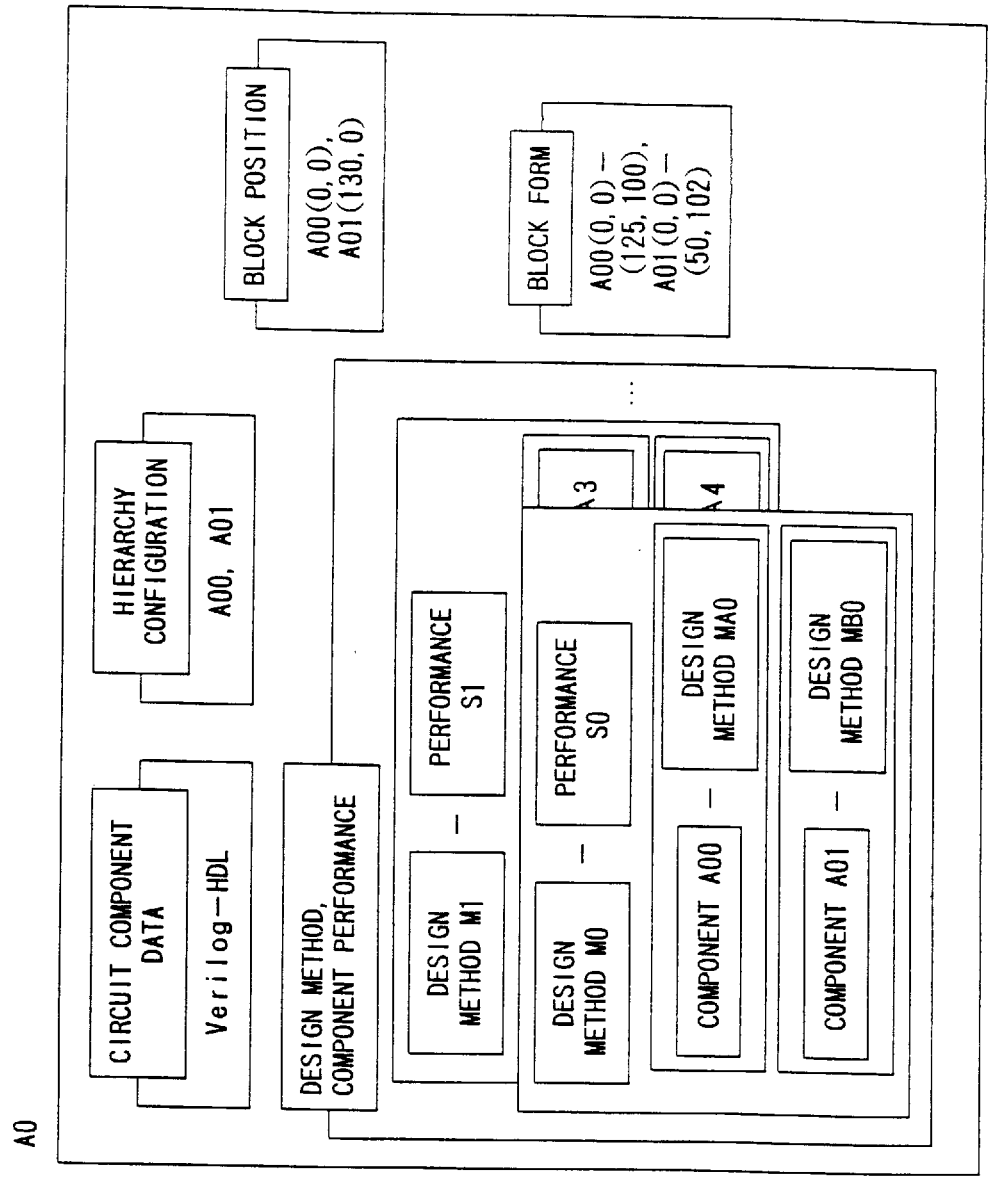
FIGS. 18A and 18B are diagrams each showing a way of storing circuit components in the circuit component storage unit of FIG. 16.
Figure 18B:
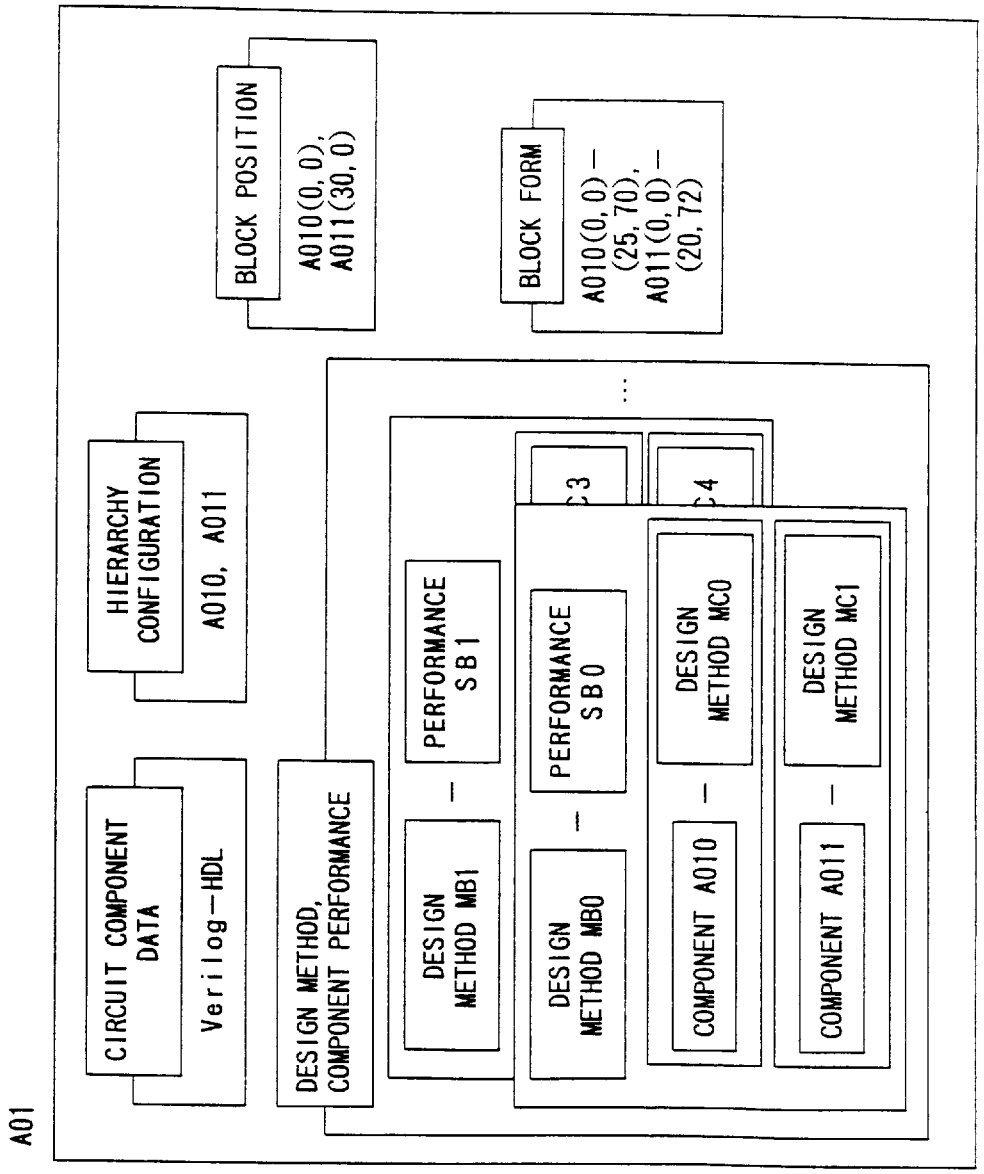

FIG. 16 is a diagram showing a revision of the FIG. 1 LSI design automation system. The circuit component storage unit 111 stores a circuit component formed by a single component and a circuit component that is implemented by a combination of plural subordinate circuit components. FIG. 17 shows examples of the circuit components stored in the storage unit 111. FIG. 17 shows COMPONENTS A to C (1701 to 1703) each of which is formed by a single component and COMPONENT M (1704) formed by a combination of plural subordinate circuit components. COMPONENT M has a hierarchical structure, as shown in FIG. 12. As detailed in FIGS. 18A and 18B, a circuit component having plural subordinate circuit components holds circuit data, layout design method information for generating layout data from the circuit data, block form information that is implemented by the circuit component, and block position information descriptive of a location relationship between the subordinate circuit components. A circuit component of a single component holds circuit data, layout design method information, and block form information.

Referring again to FIG. 16, the circuit component selection unit 103 selects from the storage unit 111 a combination of circuit components constructing an object circuit. A component interconnection information input unit 1602 inputs information about interconnection between the circuit components constructing the object circuit. A block information retrieval unit 1601 is a means for retrieving from the storage unit 111 block position information descriptive of a block position relationship between the circuit components constituting the object circuit and block form information for each circuit component.

The design method execution unit 105 of FIG. 16 has a layout design unit 1603 and a circuit component function logic design unit 1604. The layout design unit 1603 has a floor plan information decision unit 1611, a circuit component layout design unit 1612 and an inter-circuit component layout design unit 1613. The decision unit 1611 determines floor plan information according to the block position information and block form information retrieved by the retrieval unit 1601. The decision unit 1611 has a function of modifying layout design method information held by a circuit component to change a block form that is implemented by the circuit component. The layout design unit 1612 performs layout generation of each component by applying to each circuit data either a layout design method held by each of the circuit components constructing the object circuit or a layout design method modified by the decision unit 1611. The layout design unit 1613 executes a layout generation process conforming to the inter-component interconnection information inputted by the information input unit 1602, by making use of the floor plan information selected by the decision unit 1611.

Figure 19:
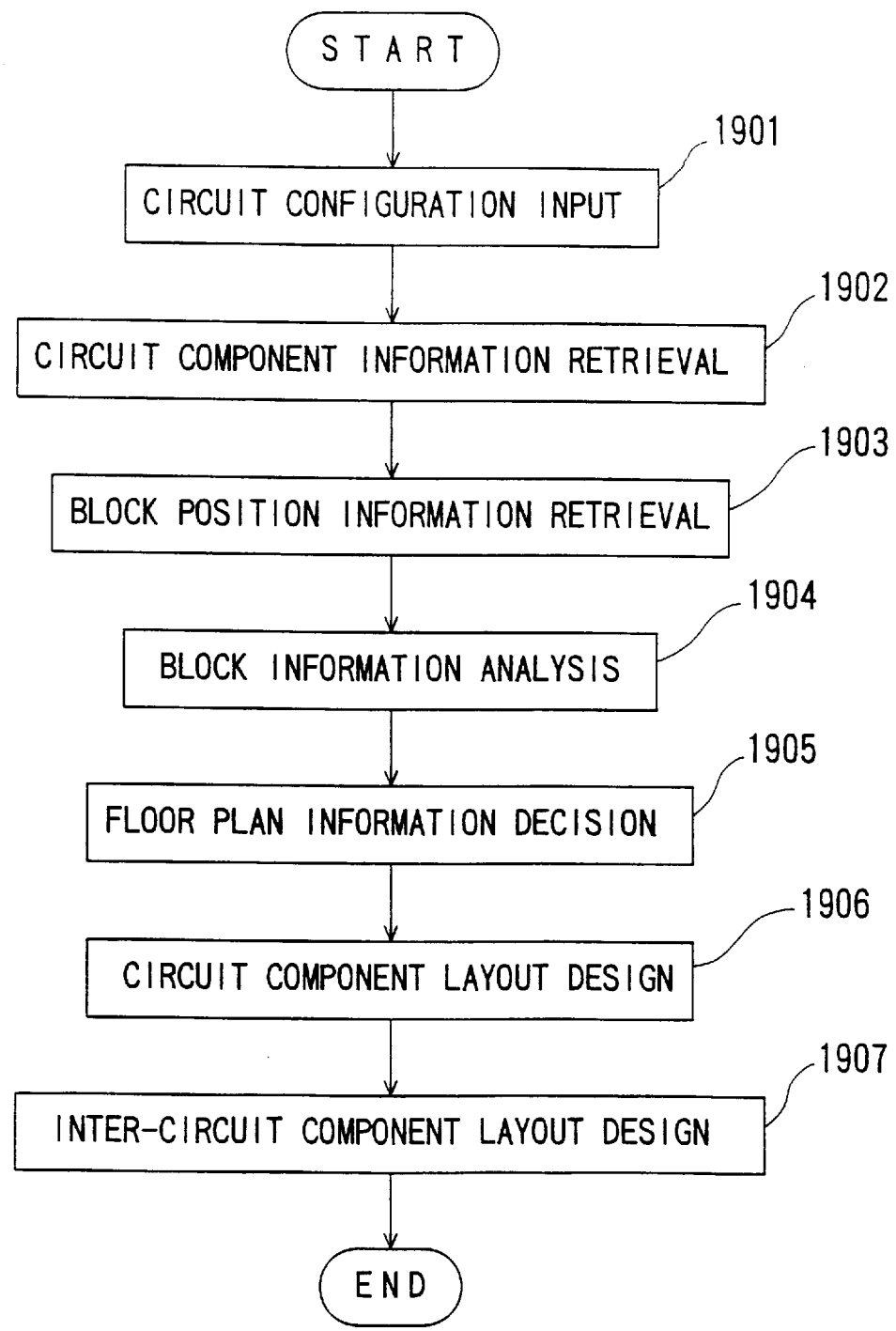
FIG. 19 is a flowchart showing processing steps in the LSI design automation system of FIG. 16.
Figure 20:
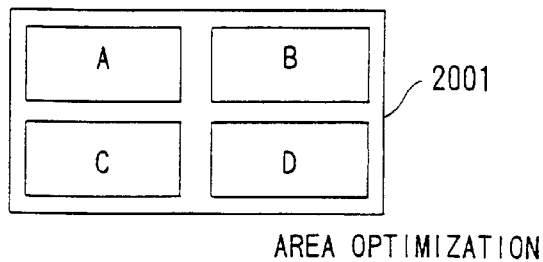
FIGS. 20A to 20D are diagrams each showing a process of determining floor plan information by means of the LSI design automation system of FIG. 16.
Figure 20:
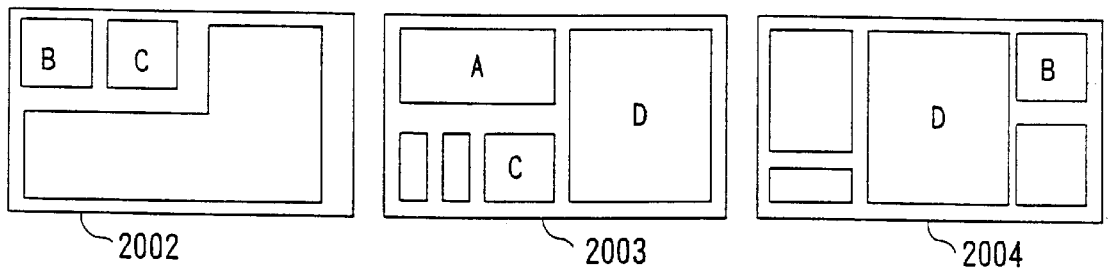
Figure 20:
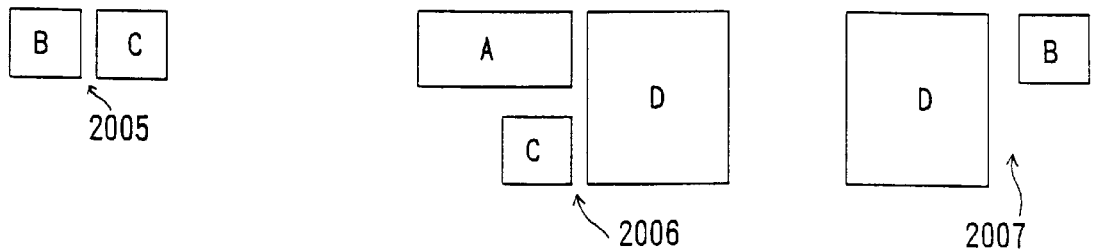
Figure 20:
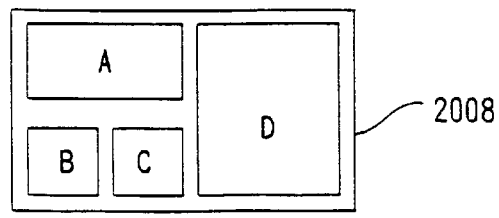

FIG. 19 is a diagram flowcharting design processing executed by the FIG. 16 LSI design automation system. Referring to FIGS. 20A to 20D, the FIG. 19 design processing is explained. At STEP 1901, a combination of circuit components constituting an object circuit is selected from the storage unit 111. Such a circuit configuration inputted at STEP 1901 is CIRCUIT CONFIGURATION 2001 of CIRCUIT COMPONENTS A to D. STEP 1902 makes a search, to find layout design method information for generating layout data from circuit data held by each of the circuit components constituting the object circuit, and information descriptive of a block form that is implemented by each component. STEP 1903 retrieves block position information descriptive of a location relationship between the circuit components constituting the object circuit from the storage unit 111. In this case, as is shown in FIG. 20B, CIRCUIT COMPONENTS 2002, 2003, 2004 are retrieved each of which contains at least two or more circuit components constituting the object circuit for retrieval of block position information. An example of this is shown in FIG. 20C, e.g., 2005, 2006, 2007. Here, such a retrieval process is performed on the basis of the physical location relationship between the circuit components constituting the object circuit. At STEP 1904, both the block position information of STEP 1903 and the block form information of STEP 1902 are analyzed, in order to extract information capable of implementing a floor plan conforming to desired conditions. In this case, as information based on which a floor plan is determined, BLOCK POSITION INFORMATION 2005 and BLOCK POSITION INFORMATION 2006 are extracted. Based on the extracted information, STEP 1905 determines a floor plan for the object circuit. In other words, FLOOR PLAN INFORMATION 2008 is decided from Block position INFORMATION 2005 and Block position INFORMATION 2006. At STEP 1906, layout generation of each component is executed by applying layout design method information held by each of the circuit components constructing the object circuit, to each circuit data. At STEP 1907, by making use of the floor plan information determined at STEP 1905, a layout generation process for the object circuit is performed. As described above, only by inputting a circuit configuration, automatic generation of a circuit conforming to a balanced floor plan can be performed.

The floor plan information decision unit 1611 modifies a layout design method for implementing a modification in the form of a layout to be generated. Where an automatic layout wire routing tool is used for layout design, a modification to a layout design method can be made by making an input parameter modification. Additionally, the decision unit 1611 divides circuit data held by a circuit component into plural items and defines a layout design method to a respective circuit data item. Conversely, it is possible for the decision unit 1611 to merge plural circuit components holding the same layout design method information into one circuit component and define a layout design method to that merged circuit component.

Figure 21:
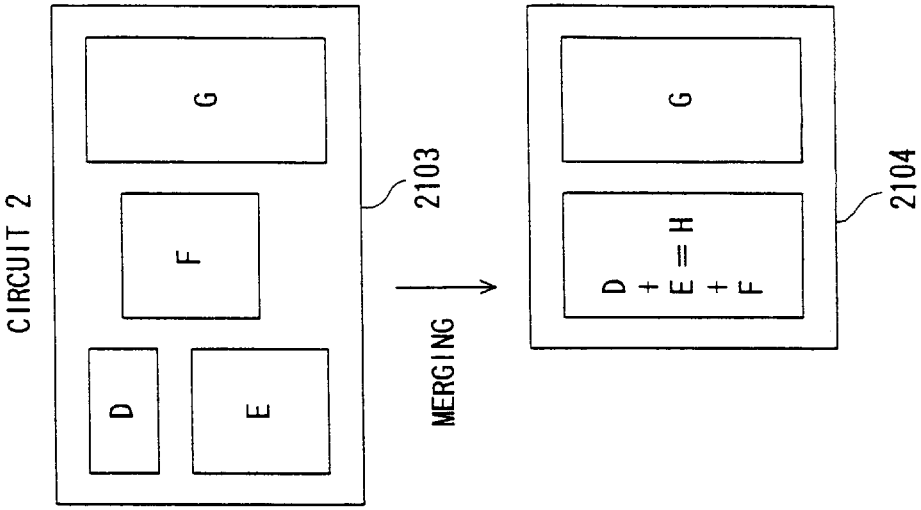
FIGS. 21A and 21B are diagrams respectively showing a process of splitting circuit data and a process of merging circuit data in the LSI design automation system of FIG. 16.
Figure 21:
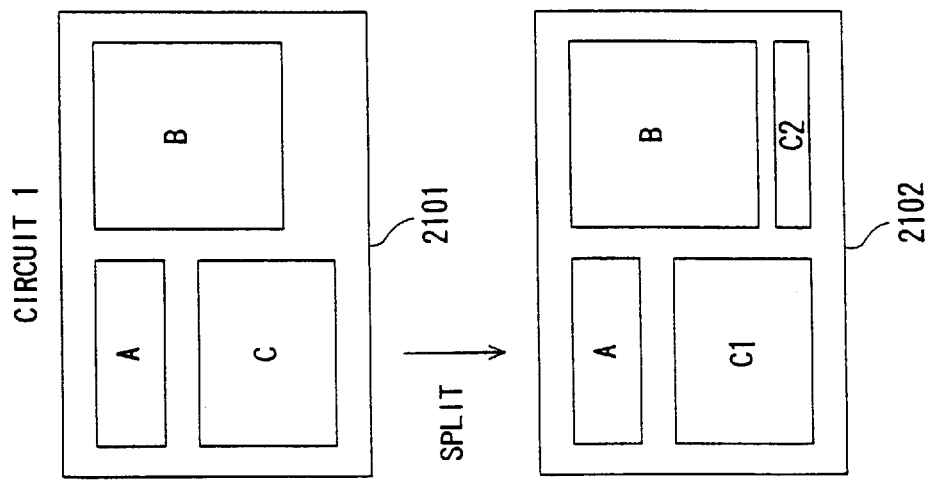

Referring to FIGS. 21A and 21B, the division of a circuit component as well as the merging of circuit components is described. As shown in FIG. 21A, a circuit 1 has a circuit configuration made up of CIRCUIT COMPONENTS A, B, and C. Block form information is retrieved which proves that the circuit 1 implements a shape of 2101. Next, a modification is made to a design method for minimizing the shape that is implemented by the circuit 1. CIRCUIT COMPONENT C is divided into C1 and C2 and a layout design method is set to each of them. Execution of the design of the circuit 1 results in generation of a circuit with a shape as shown by 2102. Referring to FIG. 21B, a way of designing a circuit 2 is described. The circuit 2 has a circuit configuration of CIRCUIT COMPONENTS D, E, F, and G. Block form information is retrieved which proves that the circuit 2 is a circuit that can implement a shape of 2103. Next, a design method modification is made to minimize the shape that is implemented by the circuit 2. CIRCUIT COMPONENTS D, E, F are merged into one, i.e., COMPONENT H, provided that they hold the same design method information. Design method information is set to COMPONENT H. Execution of the design of the circuit 2 results in generation of a circuit with a shape as shown by 2104.

As detailed above, the LSI design automation system of FIG. 16 implements an optimum layout design way.

The invention claimed is:

1. An LSI design automation system, comprising:
   (a) a circuit component storage unit for storing circuit components,
   each of which comprises,
   a circuit data item,
   plural design method information items that are utilized in design-processing said circuit data item, and plural component performance information items about performances that are implemented by circuits each of which is generated by applying said design method information item to said circuit data item;
   (b) an input unit comprising,
   a requirements specification input unit and a circuit component configuration input unit,
   said requirements specification input unit inputting function and performance information about a desired, object circuit,
   said circuit component configuration input unit inputting combination information about circuit components selected from said circuit component storage unit and capable of constructing said object circuit when combined;

(c) a circuit component selection unit for selecting from said circuit component storage unit either a circuit component conforming to said requirements specification or a circuit component conforming to said combination information;

(d) a design process unit comprising,
a design method execution unit for circuit generation,
a circuit modification/generation unit for circuit modification and circuit generation, and
a circuit analysis unit for circuit evaluation;

(e) a design method decision unit for selecting from said circuit component storage unit a design method information item to execute a design process capable of providing either a performance conformable to said circuit component selected by said circuit component selection unit or a performance conformable to a circuit component modified or generated by said circuit modification unit; and (f) a component entry unit for entering a new circuit component with a circuit data item, a design method information item of said new circuit component obtained from a design modification made, into said circuit component storage unit;

wherein:
said design method execution unit applies said design method information item selected by said design method decision unit, to said circuit data item contained in each of said circuit components stored in said circuit component storage unit, or to a circuit data item contained in a circuit component modified or generated by said circuit modification/generation unit, for execution of said design process;

said circuit analysis unit evaluates a performance that is implemented by a circuit that is generated using said circuit component selected by said circuit component selection unit, and extracts information about a performance that has been implemented by a circuit generated by said design method execution unit; and said circuit modification unit, when a result of an analysis by said circuit analysis unit is found unconformable to said requirements specification, modifies either circuit data and design method information items contained in said circuit component selected by said circuit component selection unit or said circuit generated by said design method execution unit, in order to have said requirements specification fit.

2. The LSI design automation system according to claim 1,
said design method decision unit including:
a circuit component translation information storage unit for storing circuit component translation information for process technology dependent translation of contents of said circuit component including a circuit data item, design method information items and component performance information items; and
circuit components translation unit for applying said circuit component translation information to a circuit component inputted from said circuit component storage unit for constructing said object circuit, and subjecting said inputted circuit components to a translation process.

3. The LSI design automaton system according to claim 1,
said circuit component storage unit storing, for each circuit component in the form of a hierarchical structure having plural subordinate circuit components, block position information descriptive of relative location relationships between said subordinate circuit components and block form information of each of said subordinate circuit components;

said LSI design automation system further comprising:
a block information retrieval unit for retrieving block position information and block form information about said circuit component selected by said circuit component selection unit; and
a floor plan information decision unit for determining floor plan information for said object circuit from said block position information and block form information retrieved by said block information retrieval unit.

4. An LSI design automation method for use by an LSI design automation system, comprising:
a requirements specification input step of inputting, as a requirements specification, information about both a function and a performance that are implemented by an object circuit;
a circuit configuration input step of inputting circuit configuration information for implementing a circuit conforming to said requirements specification;
a circuit component selection step of selecting a circuit component from circuit components stored in a circuit component storage unit on the basis of said circuit configuration information inputted at said circuit configuration input step;
a design method decision step of selecting a design method information item from design method information items contained in each of said circuit components stored in said circuit component storage unit on the basis of a corresponding component performance information item, and utilizing said selected design method information item to fit said requirements specification;
a design method execution step of executing a circuit design process to generate a circuit by applying said design method information item selected at said design method decision step, to a circuit data item contained in each of said circuit components stored in said circuit component storage unit;
a design result analysis step of analyzing said circuit generated at said design method execution step, and extracting information about a performance that is implemented by said generated circuit;
a design result evaluation step of comparing said information extracted at said design result analysis step with said requirements specification, and performing an evaluation to determine whether said generated circuit conforms to said requirements specification;
a circuit modification step of modifying, when said generated circuit is found unconformable to said requirements specification, said generated circuit; and
an entry step of entering, when a circuit modification is made at said circuit modification step, a new circuit component with a circuit data item, a design method information item and a component performance information of said new circuit component resulting from said circuit modification, into said circuit component storage unit.

5. The LSI design automation method according to claim 4,
said design method decision step further including,
a step for searching, if design work is to be performed using an input circuit data item which is not stored in said circuit component storage unit, through said circuit component storage unit for a circuit component with a circuit data item similar to said input circuit data item, and selecting a design method information item from said circuit component.

6. The LSI design automation method according to claim 4, said design method decision step further including, a step for performing, if said circuit component storage unit does not store a circuit component with a design method information item for implementing said requirements specification to an input circuit data item that is not stored in said circuit component storage unit, an analysis by:

relating design method information with component performance information contained in said circuit components stored in said circuit component storage unit, evaluating component performance corresponding to said design method information item, deriving from a result of the evaluation a new design method information item for implementing said requirements specification, and selecting said derived design method information item.

7. An LSI design automation system, comprising:

(a) a circuit component storage unit for storing circuit components, each of which comprises:

circuit data, design method information that is utilized in design-processing said circuit data, and component performance information about a performance that is implemented by a circuit which is generated by applying said design method information to said circuit data;

(b) a circuit component translation information storage unit for storing circuit component translation information for process technology dependent translation of said circuit data, said design method information, and said circuit component performance information contained in said circuit component;

(c) circuit components translation unit for applying said circuit component translation information to a circuit component inputted from said circuit component storage unit for constructing an object circuit and subjecting said inputted circuit components to a translation process; and (d) a design process execution unit for executing a design process to said translated circuit components.

8. An LSI design automation method for use by an LSI design automation system, comprising:

a circuit component input step of inputting from a circuit component storage unit circuit components for constructing an object circuit;

a circuit component translation step of applying, to said inputted circuit components, circuit component translation information for process technology dependent translation of circuit data, design method information, and information about a performance that is implemented by a circuit that is generated by applying said design method information to said circuit data contained in said inputted circuit components; and a design process execution step of executing a design process to said translated circuit components.

9. An LSI design automation system comprising:

a circuit component storage unit for storing circuit components, each of which comprises, circuit data and layout design method information for generating layout data from said circuit data, and for storing, for each circuit component in the form of a hierarchical structure having plural subordinate circuit components block position information descriptive of relative location relationships between said subordinate circuit components and block form information of each of said subordinate circuit components;

a circuit component selection unit for selecting from said circuit component storage unit circuit components capable of constructing an object circuit when combined;

a block information retrieval unit for retrieving block position information and block form information about said circuit components selected by said circuit component selection unit; and a floor plan information decision unit for determining floor plan information about said object circuit from said block position information and said block form information retrieved by said block information retrieval unit.

10. The LSI design automation system according to claim 9, said LSI design automation system further comprising, an inter-circuit component layout design unit for generating a layout of said object circuit from component interconnection information about said object circuit by making use of said floor plan information determined by said floor plan information decision unit.

11. The LSI design automation system according to claim 9, said LSI design automation system further comprising, a component interconnection information input unit for inputting said component interconnection information.

12. The LSI design automation system according to claim 9, said floor plan information decision unit including, a means for modifying, with respect to said circuit component selected by said circuit component selection unit for constructing said object circuit, layout method information about said selected circuit component, to determine a layout method.

13. A layout design method for use by an LSI design automation system, comprising:

a circuit configuration input step of selecting a component configuration of an object circuit from circuit components stored in a circuit component storage unit;

a circuit component information retrieval step of retrieving circuit data, layout method information for generating layout data from said circuit data, and block form information contained in subordinate circuit components stored in said circuit component storage unit, according to said selected component configuration;

a block position information retrieval step of retrieving block position information descriptive of relative location relationships between said subordinate circuit components, according to said selected component configuration;

a block information analysis step of analyzing said retrieved block position information and said retrieved block form information; and a floor plan information decision step of determining floor plan information about said object circuit according to a result of an analysis by said block information analysis step.

14. The layout design method according to claim 13, said layout design method further comprising,
- an inter-circuit component layout design step of generating a layout of said object circuit from component interconnection information about said object circuit according to said determined floor plan information.

15. The layout design method according to claim 13, said layout design method further comprising,
- a layout design method modification step of modifying said retrieved layout design method information to change said retrieved block form information.

16. The layout design method according to claim 15, said layout design method modification step further including:
- a step of dividing said retrieved circuit data into at least two items; and
- a step of modifying said layout design method information in order to generate a layout by applying an automatic layout design tool to each of said data items.

17. The layout design method according to claim 15, said layout design method modification step further including:
- a step of merging, if there are circuit components that contain the same layout design method information, circuit data items contained in said circuit components to generate a merged circuit data item; and
- a step of modifying said layout design method information to generate a layout by applying said layout method to said merged circuit data item.

* * * * *